United States Patent
Vedula et al.

(10) Patent No.: US 10,522,687 B2
(45) Date of Patent: Dec. 31, 2019

(54) WRAP-AROUND GATE STRUCTURES AND METHODS OF FORMING WRAP-AROUND GATE STRUCTURES

(71) Applicant: QUALCOMM Incorporated, San Diego, CA (US)

(72) Inventors: Ravi Pramod Kumar Vedula, San Diego, CA (US); Stephen Alan Fanelli, San Marcos, CA (US); Farid Azzazy, Laguna Niguel, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/879,109

(22) Filed: Jan. 24, 2018

(65) Prior Publication Data

US 2018/0233600 A1    Aug. 16, 2018

Related U.S. Application Data

(60) Provisional application No. 62/459,794, filed on Feb. 16, 2017.

(51) Int. Cl.
| | |
|---|---|
| *H01L 29/786* | (2006.01) |
| *H01L 29/66* | (2006.01) |
| *H01L 29/40* | (2006.01) |
| *H01L 29/06* | (2006.01) |
| *H01L 29/423* | (2006.01) |
| *H01L 27/12* | (2006.01) |

(52) U.S. Cl.
CPC ...... *H01L 29/78648* (2013.01); *H01L 27/124* (2013.01); *H01L 29/0649* (2013.01); *H01L 29/401* (2013.01); *H01L 29/42384* (2013.01); *H01L 29/42392* (2013.01); *H01L 29/66772* (2013.01); *H01L 29/78618* (2013.01); *H01L 29/78654* (2013.01); *H01L 29/78696* (2013.01); *H01L 29/78603* (2013.01)

(58) Field of Classification Search
CPC ......... H01L 29/48648; H01L 29/78696; H01L 27/1203; H01L 21/84
See application file for complete search history.

(56) References Cited

U.S. PATENT DOCUMENTS

| | | |
|---|---|---|
| 5,583,362 A | 12/1996 | Maegawa |
| 5,804,848 A | 9/1998 | Mukai |

(Continued)

FOREIGN PATENT DOCUMENTS

| | | |
|---|---|---|
| FR | 2897981 A1 | 8/2007 |
| JP | S60107862 A | 6/1985 |
| WO | 2016209285 A1 | 12/2016 |

OTHER PUBLICATIONS

International Search Report and Written Opinion—PCT/US2018/015243—ISA/EPO—dated May 15, 2018.

*Primary Examiner* — Matthew L Reames
*Assistant Examiner* — John A Bodnar
(74) *Attorney, Agent, or Firm* — Moore IP/Qualcomm

(57) ABSTRACT

A semiconductor device includes a channel structure that includes a first oxide layer, a second oxide layer, and a channel region between the first oxide layer and the second oxide layer. The semiconductor device includes a first gate structure proximate to at least three sides of the channel structure. The semiconductor device includes a second gate structure proximate to at least a fourth side of the channel structure.

14 Claims, 12 Drawing Sheets

(56) References Cited

U.S. PATENT DOCUMENTS

| | | |
|---|---|---|
| 6,838,322 B2 | 1/2005 | Pham et al. |
| 7,141,854 B2 | 11/2006 | Lee et al. |
| 9,136,366 B2 | 9/2015 | Giraud et al. |
| 9,698,267 B2 | 7/2017 | Song et al. |
| 2004/0016968 A1* | 1/2004 | Coronel ............ H01L 29/66772 257/347 |
| 2007/0278582 A1* | 12/2007 | Goodnow ............... H01L 21/84 257/365 |
| 2017/0194213 A1 | 7/2017 | Ching et al. |
| 2017/0200738 A1 | 7/2017 | Kim et al. |

\* cited by examiner

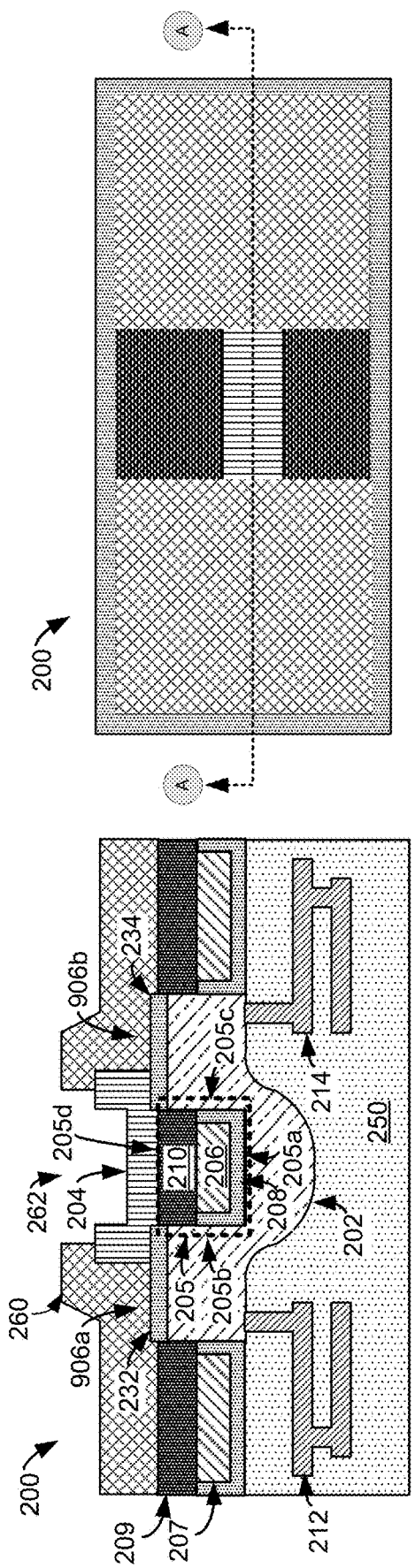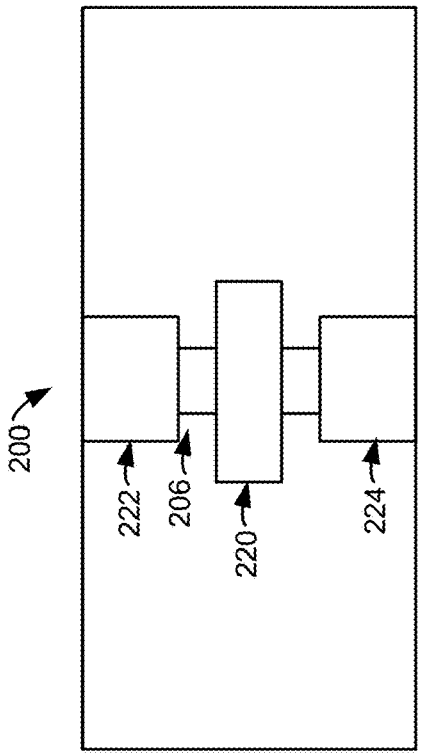
FIG. 2A
FIG. 2B
FIG. 2C

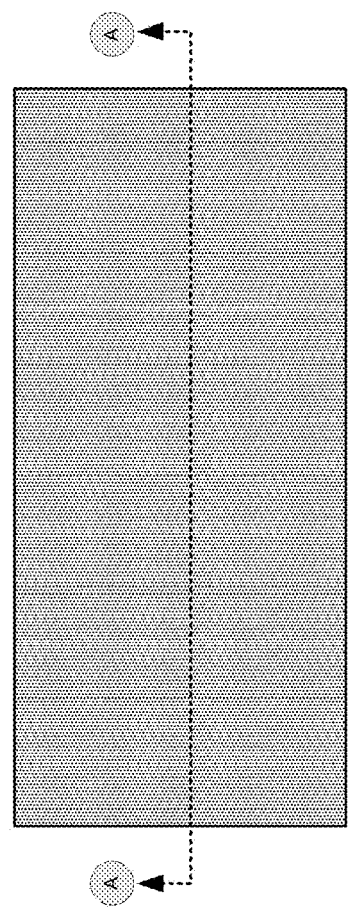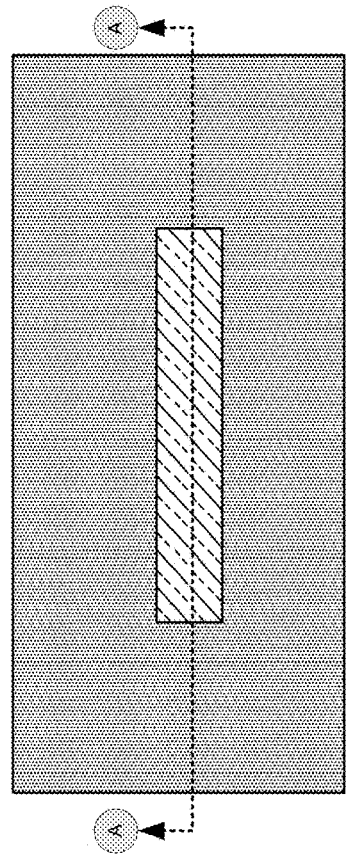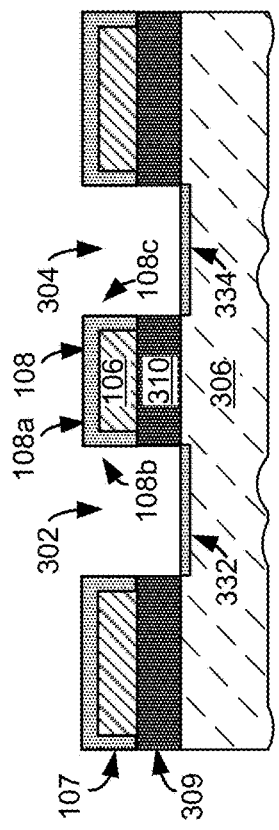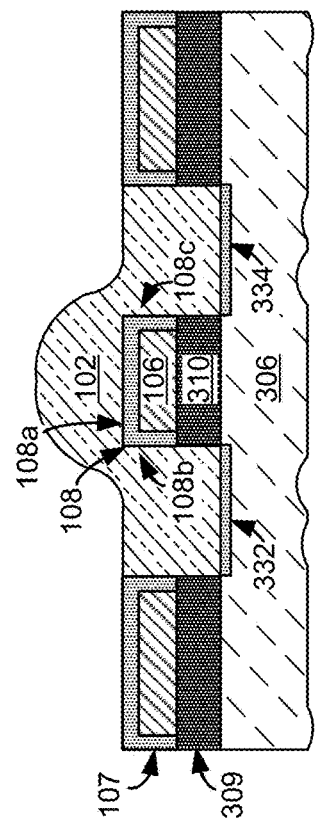
FIG. 3B
FIG. 4B
FIG. 3A
FIG. 4A

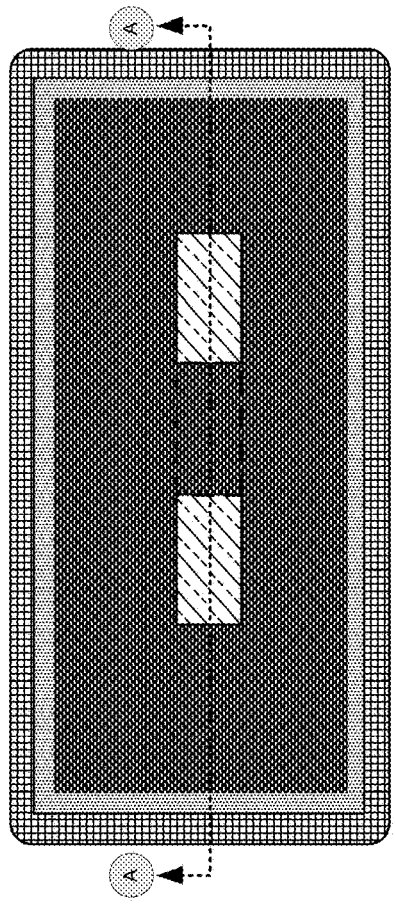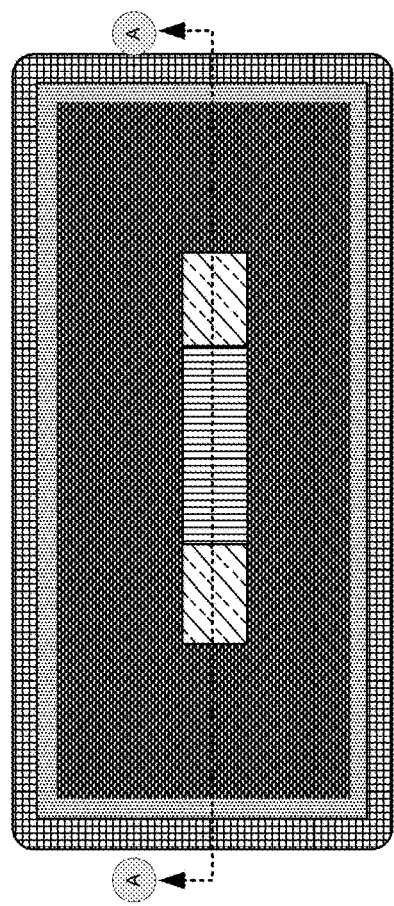
FIG. 7A
FIG. 8A
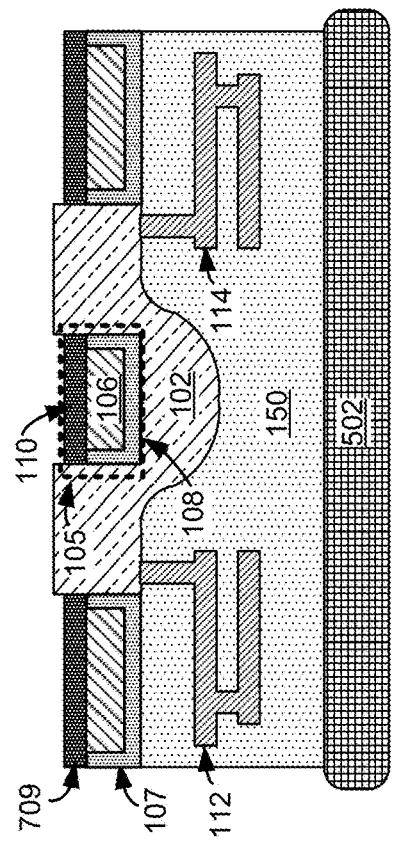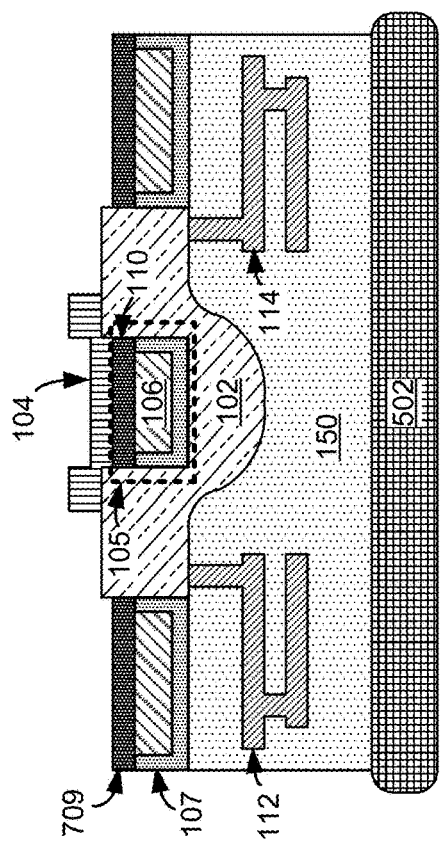
FIG. 7B
FIG. 8B

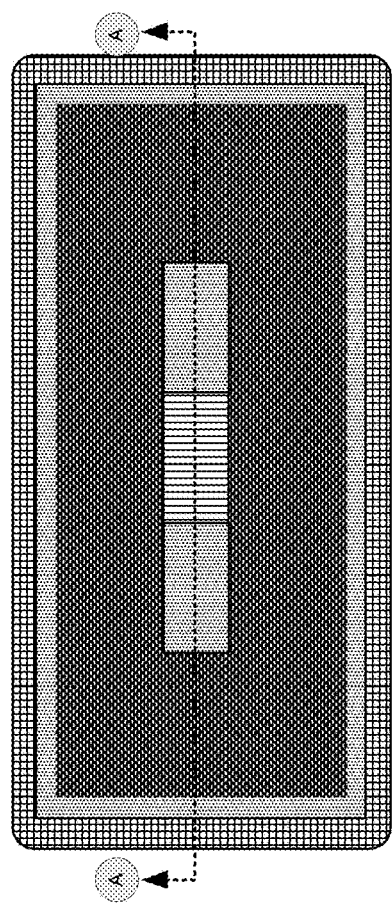
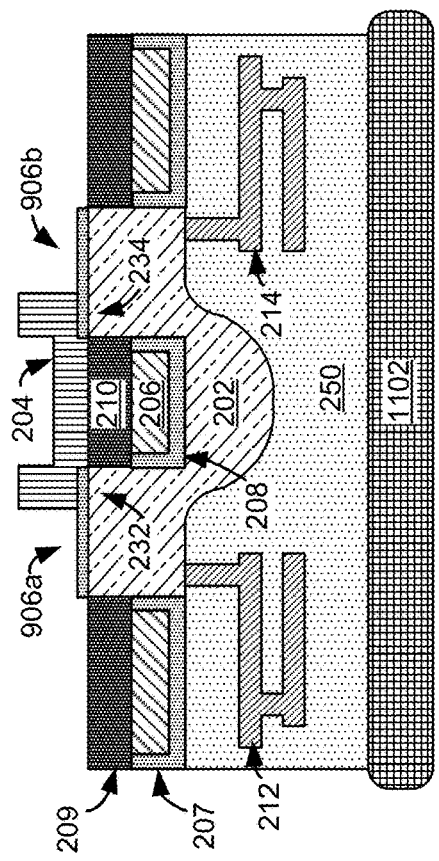
FIG. 13B
FIG. 13A

WRAP-AROUND GATE STRUCTURES AND METHODS OF FORMING WRAP-AROUND GATE STRUCTURES

I. CROSS REFERENCE TO RELATED APPLICATIONS

The present application claims the benefit of U.S. Provisional Patent Application No. 62/459,794, entitled "WRAP-AROUND GATE STRUCTURES AND METHODS OF FORMING WRAP-AROUND GATE STRUCTURES," filed Feb. 16, 2017, which is expressly incorporated by reference herein in its entirety.

II. FIELD

The present disclosure is generally related to semiconductor gate structures.

III. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

These devices may include integrated circuits (ICs) that include a gate and a channel structure. The gate may be proximate to a single side of the channel structure. Having the gate on only a single side of the channel structure may limit drive currents (saturation current) and current conductance of the ICs, and may allow significant leakage currents through the ICs.

IV. SUMMARY

In a particular aspect, a semiconductor device includes a channel structure that includes a first oxide layer, a second oxide layer, and a channel region between the first oxide layer and the second oxide layer. The semiconductor device includes a first gate structure proximate to at least three sides of the channel structure. The semiconductor device includes a second gate structure proximate to at least a fourth side of the channel structure.

In a particular aspect, a method includes forming a first gate structure on at least three sides of a channel structure that includes a first oxide layer, a second oxide layer, and a channel region between the first oxide layer and the second oxide layer. The method additionally includes forming a second gate structure on a fourth side of the channel structure.

In a particular aspect, a semiconductor device includes a channel structure that includes a first oxide layer, a second oxide layer, and a channel region between the first oxide layer and the second oxide layer. The semiconductor device includes a first gate structure on at least a first side of the channel structure. The semiconductor device includes a second gate structure on at least a second side of the channel structure and in contact with the first gate structure. Together, the first gate structure and the second gate structure two-dimensionally surround at least a portion of the channel structure.

In a particular aspect, a method includes forming a first gate structure on at least a first side of a channel structure that includes a first oxide layer, a second oxide layer, and a channel region between the first oxide layer and the second oxide layer. The method includes forming a second gate structure on at least a second side of the channel structure and in contact with the first gate structure such that together the first gate structure and the second gate structure two-dimensionally surround at least a portion of the channel structure.

In a particular aspect, a non-transitory computer-readable medium including processor-executable instructions that, when executed by a processor, cause the processor to initiate fabrication of an integrated circuit device. The integrated circuit is fabricated by forming a first gate structure on at least three sides of a channel structure including a first oxide layer, a second oxide layer, and a channel region between the first oxide layer and the second oxide layer. The integrated circuit is further fabricated by forming a second gate structure on a fourth side of the channel structure.

In a particular aspect, a non-transitory computer-readable medium including processor-executable instructions that, when executed by a processor, cause the processor to initiate fabrication of an integrated circuit device. The integrated circuit device is fabricated by forming a first gate structure on at least a first side of a channel structure that includes a first oxide layer, a second oxide layer, and a channel region between the first oxide layer and the second oxide layer. The integrated circuit is further fabricated by forming a second gate structure on at least a second side of the channel structure and in contact with the first gate structure such that together the first gate structure and the second gate structure two-dimensionally surround at least a portion of the channel structure.

Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

FIG. 2A illustrates a cross-sectional view (along line A of FIG. 2B) of a semiconductor device including first and second gate structures;

FIG. 2B illustrates a top view of the semiconductor device of FIG. 2A;

FIG. 2C illustrates a block diagram of aspects of the semiconductor device of FIG. 2A;

FIG. 3A illustrates a cross-sectional view (along line A of FIG. 3B) of an example of a first stage during fabrication of the semiconductor device of FIGS. 1A, 1B, and 1C;

FIG. 3B illustrates a top view of an example of the first stage during fabrication of the semiconductor device of FIGS. 1A, 1B, and 1C;

FIG. 4A illustrates a cross-sectional view (along line A of FIG. 4B) of an example of a second stage during fabrication of the semiconductor device of FIGS. 1A, 1B, and 1C;

FIG. 4B illustrates a top view of an example of the second stage during fabrication of the semiconductor device of FIGS. 1A, 1B, and 1C;

FIG. 7A illustrates a cross-sectional view (along line A of FIG. 7B) of an example of a fifth stage during fabrication of the semiconductor device of FIGS. 1A, 1B, and 1C;

FIG. 7B illustrates a top view of an example of the fifth stage during fabrication of the semiconductor device of FIGS. 1A, 1B, and 1C;

FIG. 8A illustrates a cross-sectional view (along line A of FIG. 8B) of an example of a sixth stage during fabrication of the semiconductor device of FIGS. 1A, 1B, and 1C;

FIG. 8B illustrates a top view of an example of the sixth stage during fabrication of the semiconductor device of FIGS. 1A, 1B, and 1C;

FIG. 13A illustrates a cross-sectional view (along line A of FIG. 13B) of an example of a fifth stage during fabrication of the semiconductor device of FIGS. 2A, 2B, and 2C;

FIG. 13B illustrates a top view of an example of the fifth stage during fabrication of the semiconductor device of FIGS. 2A, 2B, and 2C;

Figure 1A:
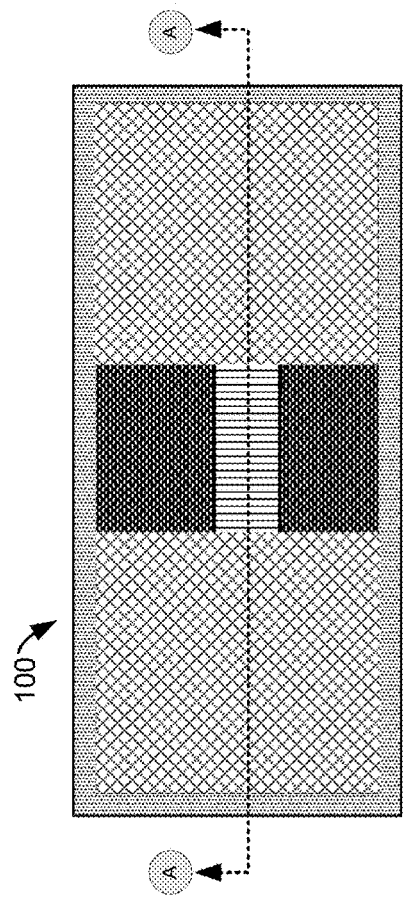
FIG. 1A illustrates a cross-sectional view (along line A of FIG. 1B) of semiconductor device including first and second gate structures that, together, two-dimensionally surround a channel structure.
Figure 1B:
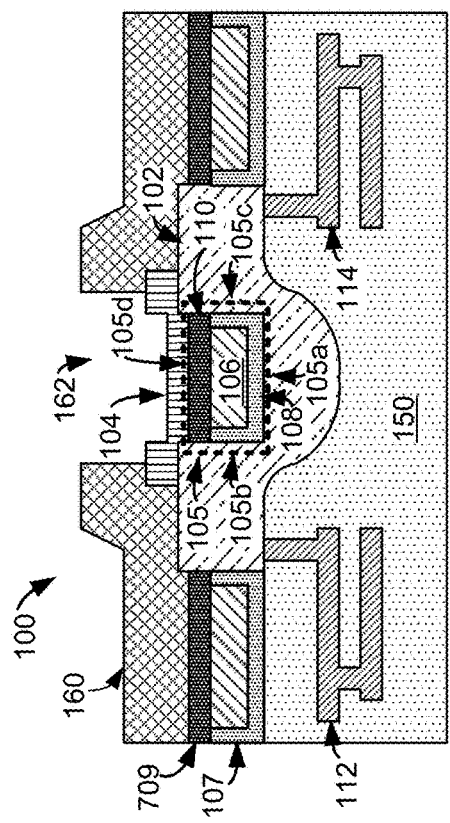
FIG. 1B illustrates a top view of the semiconductor device of FIG. 1A.
Figure 1C:
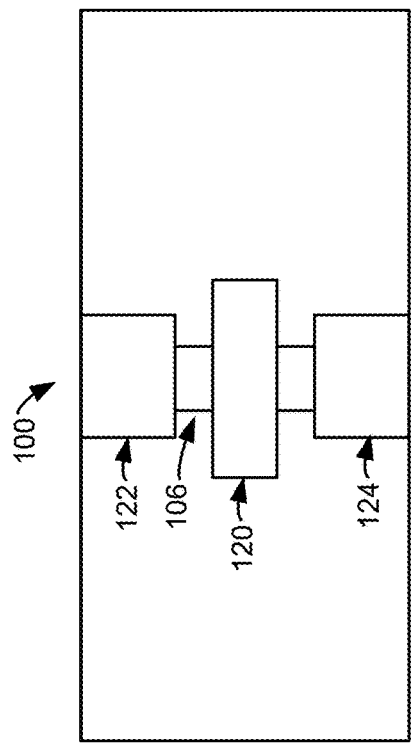
FIG. 1C illustrates a block diagram of aspects of the semiconductor device of FIG. 1A.
Figure 16:
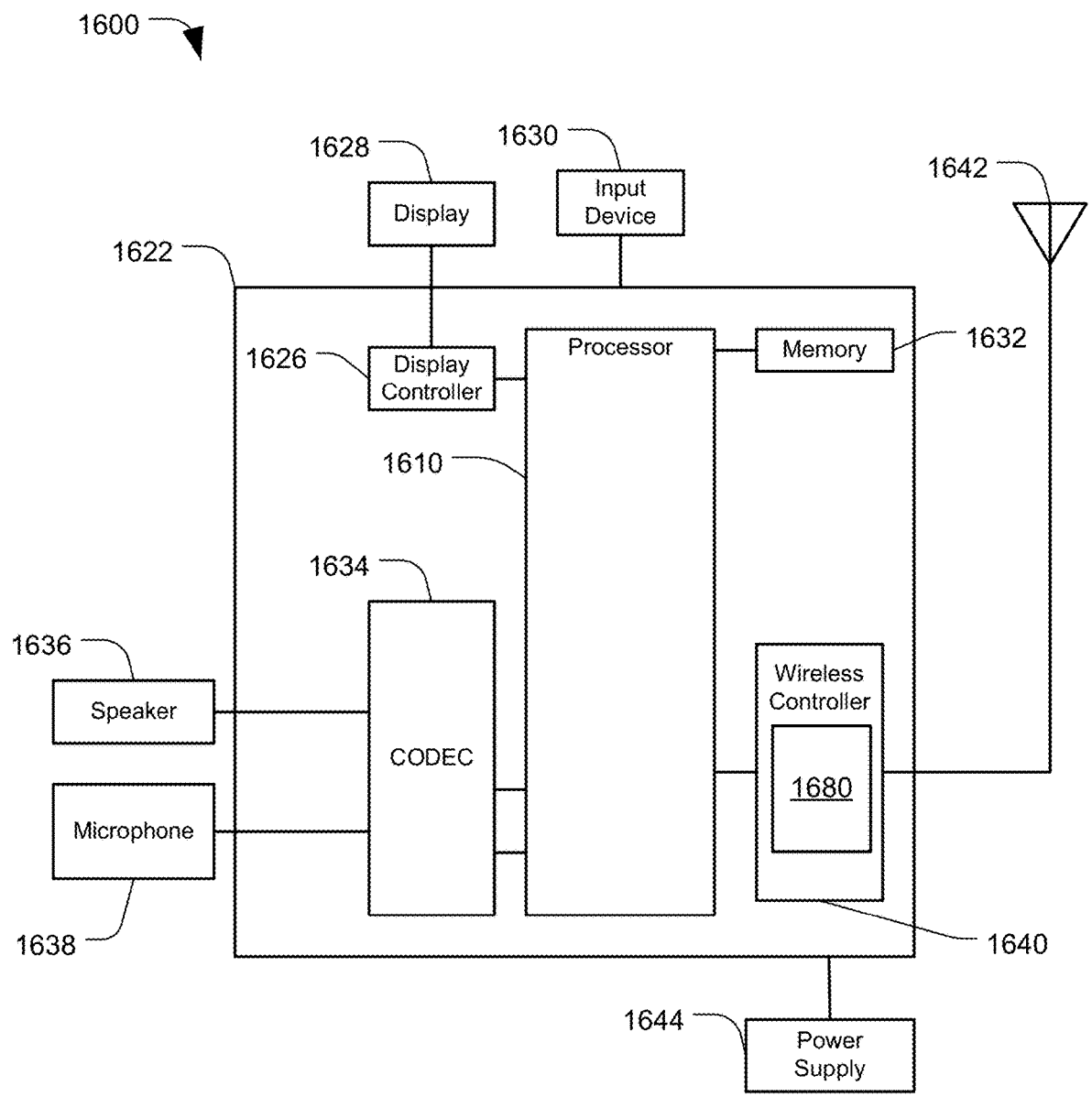
Figure 17:
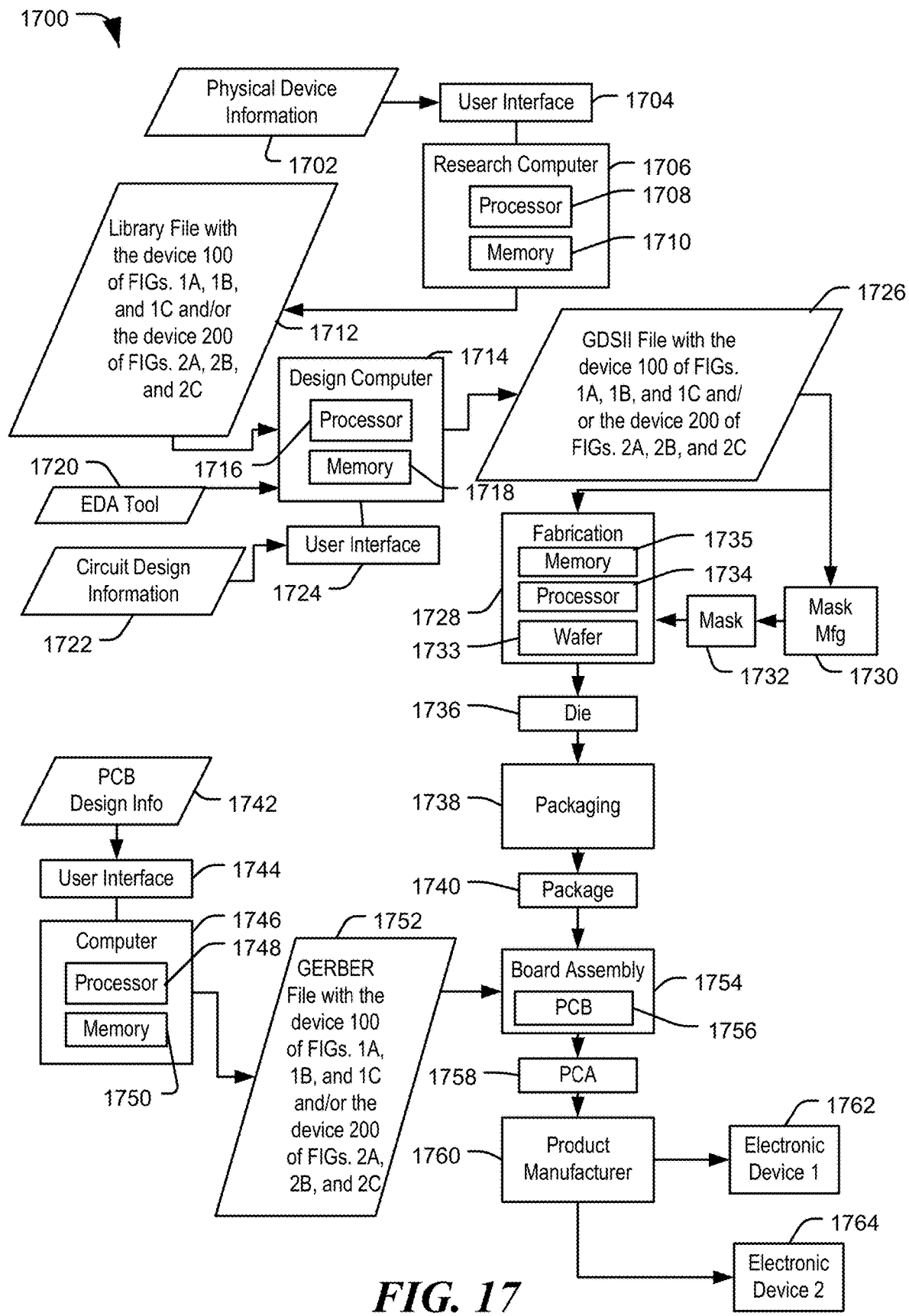

FIG. 16 is a block diagram of portable device including the semiconductor device of FIGS. 1A, 1B, and 1C, or the semiconductor device of FIGS. 2A, 2B, and 2C; and FIG. 17 is a data flow diagram of a particular illustrative example of a manufacturing process to manufacture electronic devices that include the semiconductor device of FIGS. 1A, 1B, and 1C or the semiconductor device of FIGS. 2A, 2B, and 2C.

VI. DETAILED DESCRIPTION

Semiconductor devices described herein include a gate-all-around structure proximate to a channel structure (that includes a channel region) that has a cross-section that includes multiple sides (e.g., four sides). In some implementations, the gate-all-around structure includes portions proximate to (e.g., on, covering, adjacent to, etc.) the multiple sides (e.g., proximate to the four sides) of the channel structure, enabling the gate-all-around structure to control the channel region from the multiple sides (e.g., from the four sides) of the channel structure. Controlling the channel region from the multiple sides (e.g., from all of the sides of the cross-section of the channel structure) may enable higher driver current and current conductance, and may limit leakage current through the semiconductor device that includes the gate-all-around structure, as compared to gate structures that control the channel region at a single side of the channel structure or at fewer than all sides of a cross-section of the channel structure. Additionally, in some embodiments, the gate-all-around structure is formed of two independently controllable gate structures, which may enable the gate structure to independently bias the channel from different sides using the independently controllable gate structures. Additionally, methods of forming a semiconductor device including the gate-all-around structure may be performed using a layer transfer process.

FIGS. 1A, 1B, and 1C illustrate views of an example of a semiconductor device (e.g., an integrated circuit (IC) or a portion of an IC) 100 that includes a first gate structure 102 and a second gate structure 104 that is in contact with the first gate structure 102. The semiconductor device 100 may correspond to a transistor (or a portion of a transistor). In some examples, the semiconductor device 100 may be implemented as a transistor in a radio frequency (RF) complementary metal-oxide semiconductor (CMOS). The semiconductor device 100 may be formed as described in more detail below with reference to first, second, third, fourth, fifth, and sixth fabrication stages illustrated in FIGS. 3A and 3B, 4A and 4B, 5A and 5B, 6A and 6B, 7A and 7B, and 8A and 8B, respectively.

The first and second gate structures 102 and 104 may include conductive material arranged around a channel structure 105. For example, the first gate structure 102 may be formed of or include a metal or a polysilicon material. The second gate structure 104 may be formed of the same material as the first gate structure 102 or may be formed of a different material than the first gate structure 102. In some examples, the second gate structure 104 corresponds to a lower metal 1 layer. In these examples, the second gate structure 104 may be formed of or may include copper, aluminum (Al), any other conductive metal/alloy.

The semiconductor device 100 additionally includes the channel structure 105. In the example illustrate in FIG. 1A, the channel structure 105 includes a first oxide layer 108, a second oxide layer 110, and a channel region 106 between the first oxide layer 108 and the second oxide layer 110. The channel region 106 may be formed of a portion of a semiconductive layer 107 of a silicon on insulator (SOI) wafer. For example, the portion of the semiconductive layer of the SOI wafer may correspond to a portion of the semiconductive layer 107 located between first and second trenches formed in the semiconductive layer 107 as described in more detail below with reference to the first and second trenches 302 and 304 of FIGS. 3A and 3B.

As described in more detail below, the second oxide layer 110 may correspond to a portion of a buried oxide layer (of the SOI) that has been thinned subsequent to removal of a handle material 306 of FIG. 3A (e.g., a handle wafer) of the SOI that is coupled to the buried oxide layer. For example, a buried oxide layer 309 of FIGS. 6A and 6B may be thinned to create a thinned buried oxide layer 709 of FIGS. 7A and 7B, and a portion of the thinned buried oxide layer 709 may correspond to the second oxide layer 110. The first oxide layer 108 may have a first thickness. For example, a portion of the first oxide layer 108 may have the first thickness. The second oxide layer 110 may have a second thickness. The first thickness may be the same as or distinct from the second thickness. For example, the second oxide layer 110 may be thinner than the first oxide layer 108 (or a portion of the first oxide layer 108).

Additionally, the first oxide layer 108 may be formed by an oxidation process at portions of the semiconductive layer 107 of the SOI that are exposed in response to etching of the first and second trenches in the semiconductive layer 107 and the buried oxide layer. For example, as described in more detail below with reference to FIG. 3A, subsequent to etching the first and second semiconductor trenches 302 and 304, thermal oxidation may be performed, resulting in the first oxide layer 108. As described in more detail below with reference to FIGS. 3A and 3B and FIGS. 4A and 4B, the first gate structure 102 is formed by depositing material of the first gate structure 102 in the first and second trenches 302 and 304 of FIGS. 3A and 3B.

The first oxide layer 108 may include a first (e.g., a bottom) side (e.g., side 108a of FIG. 3A) formed on a side of the semiconductive layer 107 (e.g., on a side of the channel region 106) that is opposite the side of the semiconductive layer 107 that is in contact with the thinned buried oxide layer 709. The first oxide layer 108 may include second and third sides (e.g., sides 108b and 108c, respectively, of FIG. 3A) that are formed on exposed portions of the semiconductive layer 107 in response to an oxidation process (e.g., a thermal oxidation process) as described in more detail below with reference to FIGS. 3A and 3B. In the orientation illustrated in FIGS. 1A and 1B, the second and third sides of the first oxide layer 108 extend substantially vertically and the first side of the first oxide layer 108 extends substantially horizontally.

The first gate structure 102 is located proximate to (e.g., on, in contact with, adjacent to, etc.) at least three sides of the channel structure 105. For example, a first side 105a of the channel structure 105 may correspond to the first (e.g., e.g., bottom) side of the first oxide layer 108, a second side 105b of the channel structure 105 may correspond to the second side of the first oxide layer 108, and a third side 105c of the channel structure 105 may correspond to the third side of the first oxide layer 108. In these examples, the first gate structure 102 may be proximate to the first, second, and third sides 105a, 105b, and 105c of the channel structure 105 by being in contact with one or more portions of each of the first, second, and third sides of the first oxide layer 108. The first gate structure 102 may include one or more portions proximate to (e.g., on, in contact with, adjacent to, etc.) the second oxide layer 110. In these examples, the first gate structure 102 is proximate to the second and third sides 105b and 105c of the channel structure 105 and may be proximate to the second oxide layer 110.

The second gate structure 104 is located proximate to (e.g., on, in contact with, adjacent to, etc.) a fourth side 105d of the channel structure 105. The fourth side 105d of the channel structure 105 may be opposite of the first side 105a of the channel structure 105.

Together, the first gate structure 102 and the second gate structure 104 form a wrap-around gate structure 120 (e.g., a gate-all-around structure). The wrap-around gate structure 120 may two-dimensionally surround the channel structure 105. For example, together, the first gate structure 102 and the second gate structure 104 enclose sides 105a, 105b, 105c, and 105d (e.g., all peripheral sides) of the cross-section of the channel structure 105 illustrated in FIG. 1A.

The semiconductor device 100 includes metallization (e.g., contacts and interconnects) and a dielectric portion (e.g., an inter-layer dielectric layer) 150. For example, the semiconductor device may include first metallization 112 (e.g., first contacts and/or interconnects) to contact the first gate structure 102 at a first location of the first gate structure 102. Additionally or alternatively, the semiconductor device 100 may include second metallization 114 (e.g., second contacts and/or interconnects) to contact the first gate structure 102 at a second location of the first gate structure 102.

The semiconductor device 100 may include a source region 122 and a drain region 124. The source region 122 and the drain region 124 may be formed in the semiconductive layer 107 (into the plane of paper upon which the illustrated example is depicted). During operation a channel may form in the channel region 106 between the source region 122 and the drain region 124.

Thus, the wrap-around gate structure 120 is proximate to (e.g., is on, covers, is adjacent to, etc.) all four sides of the periphery of the cross-section of the channel structure 105 illustrated in FIG. 1A, enabling the wrap-around gate structure 120 to control the channel region 106 from multiple sides (e.g., from all four sides of the periphery of the cross-section) of the channel structure 105. Controlling the channel region 106 from the multiple sides (e.g., from the sides 105a, 105b, 105c, and 105d) may enable higher driver current and current conductance, and may limit leakage current through the semiconductor device 100, as compared to controlling the channel region 106 from a single side of the channel structure 105 or at fewer than all sides of a periphery of a cross-section of the channel structure 105.

FIGS. 2A, 2B, and 2C illustrate views of an example of semiconductor device (e.g., an IC or a portion of an IC) 200 that includes a first gate structure 202 and a second gate structure 204 associated with a channel structure 205. The semiconductor device 200 may correspond to a transistor (or a portion of a transistor). In some examples, the semiconductor device 200 may be implemented as a transistor in a radio frequency (RF) complementary metal-oxide semiconductor (CMOS). The semiconductor device 200 may be formed as described in more detail below with reference to first, second, third, fourth, and fifth fabrication stages illustrated in FIGS. 9A and 9B, 10A and 10B, 11A and 11B, 12A and 12B, and 13A and 13B, respectively, The first and second gate structures 202 and 204 may be formed of conductive material. For example, the first gate structure 202 may be formed of a metal or a polysilicon material. The second gate structure 204 may be formed of the same material as the first gate structure 202 or may be formed of a different material than the first gate structure 202. In some examples, the second gate structure 204 corresponds to a lower metal 1 layer. In these examples, the second gate structure 204 may be formed of or may include copper, aluminum (Al), or any other conductive metal/alloy.

The semiconductor device 200 additionally includes the channel structure 205. In the example illustrated in FIG. 2A, the channel structure 205 includes a first oxide layer 208, a second oxide layer 210, and a channel region 206 between the first oxide layer 208 and the second oxide layer 210. The channel region 206 may be formed of a portion of a semiconductive layer 207 of a SOI wafer. For example, the portion of the semiconductive layer 207 of the SOI wafer may correspond to a portion of the semiconductive layer 207 located between first and second trenches formed in the semiconductive layer 207 as described in more detail below with reference to the first and second trenches 902 and 904 of FIGS. 9A and 9B.

As described in more detail below, the second oxide layer 210 may correspond to a portion of a buried oxide layer (of the SOI) between first and second trenches formed in a semiconductive layer and the buried oxide layer of the SOI. For example, as described in more detail below with reference to FIGS. 9A and 9B, a portion of the buried oxide layer 209 between the first and second trenches 902 and 904 of FIGS. 9A and 9B may correspond to the second oxide layer 210. The first oxide layer 208 may have a first thickness. For example, a portion of the first oxide layer 208 may have the first thickness. The second oxide layer 210 may have a second thickness. The first thickness may be the same as or distinct from the second thickness. For example, the second oxide layer 210 may be thicker than the first oxide layer 208 (or a portion of the first oxide layer 208).

The first oxide layer 108 may include a first (e.g., a bottom) side (e.g., side 108a of FIG. 3A) formed on a side of the semiconductive layer 107 (e.g., on a side of the channel region 106) that is opposite the side of the semiconductive layer 107 that is in contact with the thinned buried oxide layer 709. The first oxide layer 108 may include second and third sides (e.g., sides 108b and 108c, respectively, of FIG. 3A) that are formed on exposed portions of the semiconductive layer 107 in response to an oxidation process (e.g., a thermal oxidation process) as described in more detail below with reference to FIGS. 3A and 3B. In the orientation illustrated in FIGS. 1A and 1B, the second and third sides of the first oxide layer 108 extend substantially vertically and the first side of the first oxide layer 108 extends substantially horizontally.

Additionally, the first oxide layer 208 may be formed by an oxidation process at portions of the semiconductive layer 207 of the SOI that are exposed in response to etching of the first and second trenches in the semiconductive layer 107 and the buried oxide layer. For example, as described in more detail below with reference to FIGS. 9A and 9B, subsequent to etching the first and second trenches 902 and 904, thermal oxidation may be performed, resulting in the first oxide layer 208. As described in more detail below with reference to FIGS. 10A and 10B, the first gate structure 202 is formed by depositing material of the first gate structure 202 in the first and second trenches 902 and 904 of FIGS. 9A and 9B.

The first oxide layer 208 may include a first (e.g., a bottom) side (e.g., side 208a of FIG. 9A) formed on a side of the semiconductive layer 207 (e.g., on a side of the channel region 206) that is opposite the side of the semiconductive layer 207 that is in contact with the buried oxide layer 209. The first oxide layer 208 may include second and third sides (e.g., sides 208b and 208c, respectively, of FIG. 9A) that are formed on exposed portions of the semiconductive layer 207 in response to an oxidation process (e.g., a thermal oxidation process) as described in more detail below with reference to FIGS. 9A and 9B. In the orientation illustrated in FIGS. 2A and 2B, the second and third sides of the first oxide layer 208 extend substantially vertically and the first side of the first oxide layer 208 extends substantially horizontally.

The first gate structure 202 is located proximate to (e.g., on, in contact with, adjacent to, etc.) at least three sides of the channel structure 205. For example, a first side 205a of the channel structure 205 may correspond to a first (e.g., e.g., bottom) side of the first oxide layer 208, a second side 205b of the channel structure 205 may correspond to the second side of the first oxide layer 208, and a third side 205c of the channel structure 205 may correspond to the third side of the first oxide layer 208. In these examples, the first gate structure 202 may be proximate to the first, second, and third sides 205a, 205b, and 205c, respectively, of the channel structure 205 by being in contact with one or more portions of each of the first, second, and third sides of the first oxide layer 208. The first gate structure 202 may include one or more portions proximate to (e.g., on, in contact with, adjacent to, etc.) the second oxide layer 210. In these examples, the first gate structure 202 may be proximate to the second and third sides 205b and 205c of the channel structure 205 at least in part by being in contact with sides of the second oxide layer 210

The second gate structure 204 is located proximate to (e.g., on, in contact with, adjacent to, etc.) a fourth side 205d of the channel structure 205. The fourth side 205d of the channel structure 205 may be opposite of the first side 205a of the channel structure 205.

The semiconductor device 200 may additionally include a first portion 906a of a handle material (e.g., the handle material 906 of FIGS. 9A and 9B) and a second portion 906b of a handle material that have been doped as described in more detail below with reference to FIGS. 9A and 9B. Together, the first gate structure 202 and the second gate structure 204 form a wrap-around gate structure 220. The semiconductor device 200 may additionally include a third oxide layer 232 and a fourth oxide layer 234. The third oxide layer 232 and the fourth oxide layer 234 may be formed on the first portion 906a and the second portion 906b of the handle material in response to exposing portions of the handle material defining portions (e.g., bottom portions of) the first and second trenches as described below in more detail with reference to FIGS. 9A and 9B. The third oxide layer 232 and the fourth oxide layer 234 may be between the second gate structure 204 and the first gate structure 202. In these examples, the first gate structure 202 is not in contact with the second gate structure 204, which enables independent biasing of the first gate structure 202 and the second gate structure 204.

The semiconductor device 200 includes metallization (e.g., contacts and interconnects) and a dielectric portion (e.g., an inter-layer dielectric layer) 250. For example, the semiconductor device 200 may include first metallization 212 (e.g., first contacts and/or interconnects) to contact the first gate structure 202 at a first location of the first gate structure 202. Additionally or alternatively, the semiconductor device 200 may include second metallization 214 (e.g., second contacts and/or interconnects) to contact the first gate structure 202 at a second location of the first gate structure 202. The semiconductor device may additionally include third metallization [not illustrated] coupled to the second gate structure 204 to enable the second gate structure 204 to be biased independently of the first gate structure 202.

The semiconductor device 200 may include a source region 222 and a drain region 224. The source region 222 and the drain region 224 may be formed in the semiconductive layer 207. During operation a channel may form in the channel region 206 between the source region 222 and the drain region 224.

Thus, the wrap-around gate structure 220 is proximate to (e.g., is on, covers, is adjacent to, etc.) all four sides of the periphery of the cross-section of the channel structure 205 illustrated in FIG. 2A, enabling the wrap-around gate structure 220 to control the channel region 206 from multiple sides (e.g., from all four sides of the periphery of the cross-section) of the channel structure 205. Controlling the channel region 206 from the multiple sides (e.g., from the sides 205a, 205b, 205c, and 205d) may enable higher drive current and current conductance, and may limit leakage current through the semiconductor device 200, as compared to controlling the channel region 206 from a single side of the channel structure 205 or at fewer than all sides of a periphery of a cross-section of the channel structure 205. Additionally, the separation between the first gate structure 202 and the second gate structure 204 enables independent biasing of the channel region 206 during operation (e.g., enables the first gate structure 202 to apply a bias to the channel region independently of whether the second gate structure 204 applies a bias to the channel region, and vice versa).

FIGS. 3A and 3B illustrate an example of a first stage during fabrication of the semiconductor device 100 of FIGS. 1A, 1B, and 1C. The first stage of FIGS. 3A and 3B may include forming first and second trenches 302 and 304 in the semiconductive layer 107 and the buried oxide layer 309. In conjunction with the handle material 306 (e.g., of a handle wafer of an SOD, the semiconductive layer 107 and the buried oxide layer 309 (e.g., prior to forming the first and second trenches 302 and 304) may correspond to or form an SOI wafer. The semiconductive layer 107 may include a layer of monocrystalline silicon. The buried oxide layer 309 may be adjacent to the layer of monocrystalline silicon. In some examples, the first and second trenches 302 and 304 may be formed by performing one or more etches. For example, a first etching process may be performed to form the portions of the first and second trenches 302 and 304 in the semiconductive layer 107 and a second etching process may be performed to form the portions of the first and second trenches 302 and 304 in the buried oxide layer 309. The semiconductor device 100 may include a portion 310 of the buried oxide layer 309 that is between the first and second trenches 302 and 304.

The first stage during fabrication of the semiconductor device 100 may additionally include performing an oxidation process, such as thermal oxidation. For example, a thermal oxidation process may be performed subsequent to forming the first and second trenches 302 and 304, and an oxide may form on the semiconductive layer 107 in response to exposing material of the semiconductive layer 107 to oxygen at a high temperature (e.g., approximately 1150 degrees Celsius). For example, in response to or during the thermal oxidation, the first oxide layer 108 may form on the portion of the semiconductive layer 107 that is between the first and second trenches 302 and 304, resulting in the first oxide layer 108 described above with reference to FIGS. 1A, 1B, and 1C. The first oxide layer 108 may include a first side 108a, a second side 108b, and a third side 108c as described above with reference to FIGS. 1A, 1B, and 1C. The first side 108a, the second side 108b, and the third side 108c may form a portion of the channel structure 105 of FIGS. 1A, 1B, and 1C. Additionally, an oxide may form in response to exposing portions of the handle material 306 to oxygen at high temperature during the thermal oxidation process. For example, in response to or during the thermal oxidation, the third oxide layer 332 and the fourth oxide layer 334 may form in response to exposing portions of the handle material 306 that define (e.g., that define a bottom portion of) the first and second trenches 302 and 304 to oxygen at a high temperature.

FIGS. 4A and 4B illustrate an example of a second stage during fabrication of the semiconductor device 100 of FIGS. 1A, 1B, and 1C. The second stage may be subsequent to the first stage. The second stage includes forming the first gate structure 102. Forming the first gate structure 102 includes depositing material of the first gate structure 102 in the first trench 302 and in the second trench 304. Forming the first gate structure 102 also includes depositing the material of the first gate structure 102 on the first side 108a of the first oxide layer 108. The first oxide layer 108 may be between portions of the first gate structure 102 and the portion of the semiconductive layer 107 between the first and second trenches 302 and 304 (e.g., may be between the first gate structure 102 and the channel region 106). Thus, the first gate structure 102 may not contact the channel region 106. In some examples, the first oxide layer 108 serves as a gate oxide between portions of the first gate structure 102 and the channel region 106. Additionally, the portion 310 may be between portions of the first gate structure 102 and the channel region 106. In conjunction, the first oxide layer 108 and the portion 310 may two-dimensionally surround the channel region 106.

Figure 5A:
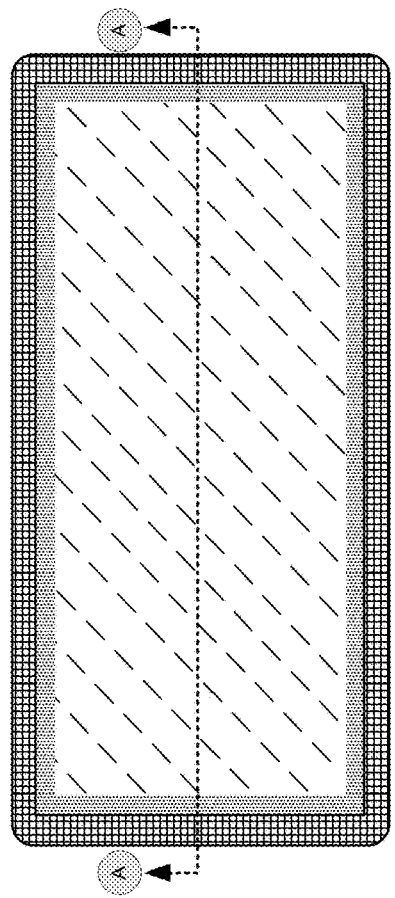
FIG. 5A illustrates a cross-sectional view (along line A of FIG. 5B) of an example of a third stage during fabrication of the semiconductor device of FIGS. 1A, 1B, and 1C.
Figure 5B:
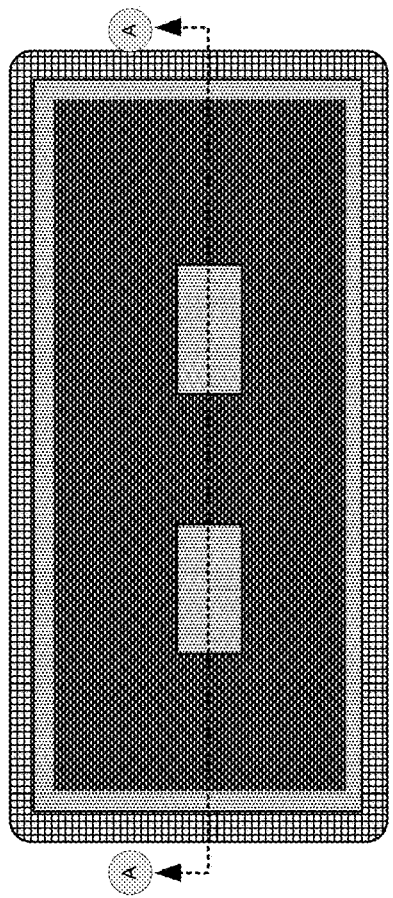
FIG. 5B illustrates a top view of an example of the third stage during fabrication of the semiconductor device of FIGS. 1A, 1B, and 1C.

FIGS. 5A and 5B illustrate an example of a third stage during fabrication of the semiconductor device 100 of FIGS. 1A, 1B, and 1C. The third stage may be subsequent to the second stage. The third stage includes forming the first metallization 112, the second metallization 114, or both. The first metallization 112 and the second metallization 114 may be formed of or include conductive material, such as a metal. In some examples, additional or different metallization than the first metallization 112 and the second metallization 114 is formed.

The third stage also includes forming a dielectric portion 150. The dielectric portion 150 may be formed of dielectric material, such as silicon dioxide. In some examples, the dielectric portion 150 is formed of a polymer, such as a polyimide. The dielectric material may be formed using a deposition technique, such as chemical vapor deposition (CVD).

The third stage also includes performing a layer transfer process to couple a carrier wafer 502 to the first gate structure 102 subsequent to forming the metallization (e.g., the first metallization 112, the second metallization 114, or both) and the dielectric portion 150. The carrier wafer 502 may be coupled to the first gate structure 102 such that the semiconductive layer 107 is between the buried oxide layer 309 and the carrier wafer 502. For example, subsequent to forming the metallization and the dielectric portion 150, the wafer may be flipped and bonded or adhered to the carrier wafer 502. The carrier wafer 502 may correspond to a CMOS wafer. In some examples, the carrier wafer 502 is formed of or includes glass.

Figure 6A:
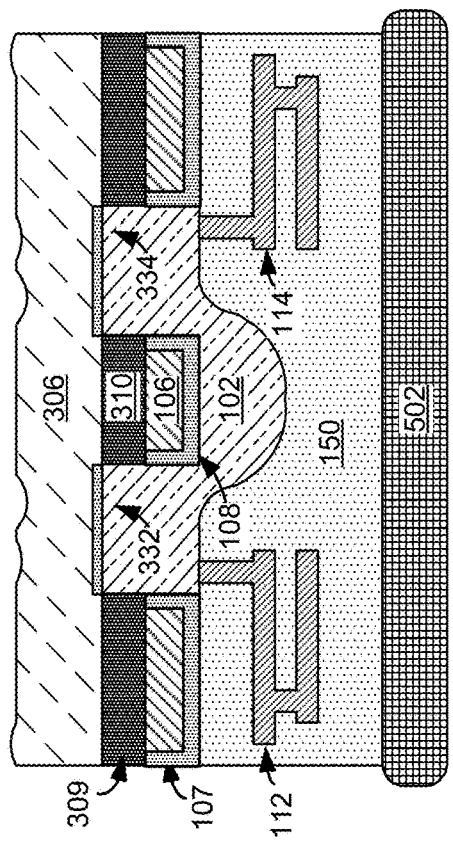
FIG. 6A illustrates a cross-sectional view (along line A of FIG. 6B) of an example of a fourth stage during fabrication of the semiconductor device of FIGS. 1A, 1B, and 1C.
Figure 6B:
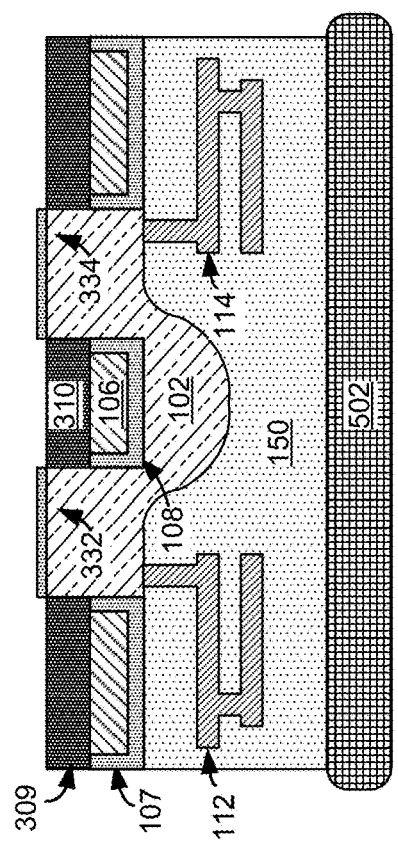
FIG. 6B illustrates a top view of an example of the fourth stage during fabrication of the semiconductor device of FIGS. 1A, 1B, and 1C.

FIGS. 6A and 6B illustrate an example of a fourth stage during fabrication of the semiconductor device 100 of FIGS. 1A, 1B, and 1C. The fourth stage may be subsequent to the third stage. The fourth stage includes removing the handle material 306. Removing the handle material 306 may expose the portion 310 of the buried oxide layer 309. In some examples, the handle material 306 may be removed using an etching process, a grinding process, or both.

FIGS. 7A and 7B illustrate an example of a fifth stage during fabrication of the semiconductor device 100 of FIGS. 1A, 1B, and 1C. The fifth stage may be subsequent to the fourth stage. The fifth stage includes removing the third and fourth oxide layers 332 and 334 and thinning the buried oxide layer 309 of FIGS. 6A and 6B to generate a thinned buried oxide layer 709. The third and fourth oxide layers 332 and 334 may be removed, and the buried oxide layer 309 of FIGS. 6A and 6B may be thinned, using an etching process, a grinding process, or both. The buried oxide layer 309 may be thinned from about twenty nanometers to about eight to ten nanometers (or to as thin as process limits allow). The thinned buried oxide layer 709 may be used as a gate oxide layer between the second gate structure 104 and the channel region 106. Using the thinned buried oxide layer 709 as a gate oxide may enable the second gate structure 104 to exert greater control or influence on the channel region 106 as opposed to using the buried oxide layer 309 as the oxide layer. The thinned buried oxide layer 709 may include the second oxide layer 110. In some examples, the second oxide layer 110 is located between opposing sides of the first gate structure 102. The second oxide layer 110, the channel region 106, and the first oxide layer 108 together form the channel structure 105 of FIG. 1.

FIGS. 8A and 8B illustrate an example of a sixth stage during fabrication of the semiconductor device 100 of FIGS. 1A, 1B, and 1C. The sixth stage may be subsequent to the fifth stage. The sixth stage includes forming the second gate structure 104. The second gate structure 104 may be formed by depositing material of the second gate structure 104 on a portion (e.g., on the second oxide layer 110) of the thinned buried oxide layer 709 and on one or more portions of the first gate structure 102. Thus, the first gate structure 102 is in contact with the second gate structure 104. A size of the exposed portion of the first gate structure 102 is scaled according to a length of the channel to aid in alignment of the first gate structure 102 with the second gate structure 104. Together, the first gate structure 102 and the second gate structure 104 two-dimensionally surround the channel structure 105. Additionally, the second oxide layer 110 may be located between the second gate structure 104 and the channel region 106 and may serve as a gate oxide for the second gate structure 104 during operation of the semiconductor device 100 of FIGS. 1A, 1B, and 1C.

Referring to FIGS. 1A, 1B, and 1C, an example of a seventh stage during fabrication of the semiconductor device 100 is illustrated. The seventh stage may be performed subsequent to the sixth stage. The seventh stage may include forming a passivation layer 160. The passivation layer 160 may be formed using a deposition process, such as CVD. In some examples, a trench 162 may be formed in the passivation layer 160 and a bond pad [not illustrated] may be formed in the trench 162. The seventh stage may include removing the carrier wafer 502 of FIGS. 8A and 8B.

Figure 9A:
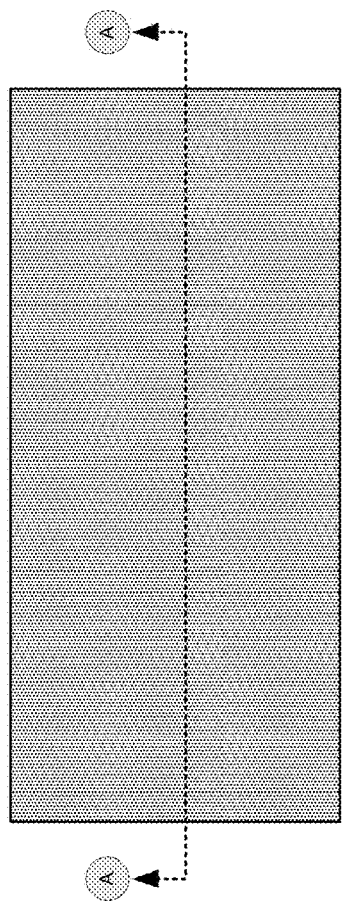
FIG. 9A illustrates a cross-sectional view (along line A of FIG. 9B) of an example of a first stage during fabrication of the semiconductor device of FIGS. 2A, 2B, and 2C.
Figure 9B:
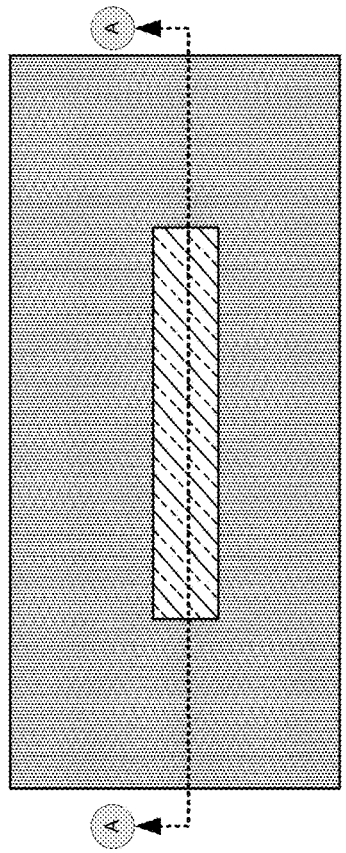
FIG. 9B illustrates a top view of an example of the first stage during fabrication of the semiconductor device of FIGS. 2A, 2B, and 2C.

FIGS. 9A and 9B illustrate an example of a first stage during fabrication of the semiconductor device 200 of FIGS. 2A, 2B, and 2C. The first stage of FIGS. 9A and 9B may include doping the handle material 906 to form the portions (or regions) 906a and 906b. The handle material 906 may be doped to form the portions 906a and 906b using an ion-implementation technique. For example, the ion-implementation technique may dope the portions 906a and 906b with a semiconductor dopant, such as boron, arsenic, or phosphorous.

The first stage of FIGS. 9A and 9B may include forming first and second trenches 902 and 904 in the semiconductive layer 207 and the buried oxide layer 209. In conjunction with the handle material 906 (e.g., of a handle wafer of an SOI), the semiconductive layer 207 and the buried oxide layer 209 (e.g., prior to forming the first and second trenches 902 and 904) may correspond to or form an SOI wafer. The semiconductive layer 207 may include a layer of monocrystalline silicon. The buried oxide layer 209 may be adjacent to the layer of monocrystalline silicon. In some example, the first and second trenches 902 and 904 may be formed by performing one or more etches. For example, a first etching process may be performed to form the portions of the first and second trenches 902 and 904 in the semiconductive layer 207 and a second etching process may be performed to form the portions of the first and second trenches 902 and 904 in the buried oxide layer 209.

The first stage during fabrication of the semiconductor device 200 may additionally include performing an oxidation process, such as thermal oxidation. For example, a thermal oxidation process may be performed subsequent to forming the first and second trenches 902 and 904, and an oxide may form on the semiconductive layer 207 in response to exposing material of the semiconductive layer 207 to oxygen at a high temperature (e.g., approximately 1150 degrees Celsius). For example, in response to or during the thermal oxidation, the first oxide layer 208 may form on the portion of the semiconductive layer 207 that is between the first and second trenches 902 and 904, resulting in the first oxide layer 208 described above with reference to FIGS. 1A, 1B, and 1C. For example, the first oxide layer 208 may include a first side 208a, a second side 208b, and a third side 208c. The first side 208a, the second side 208b, and the third side 208c may form a portion of the channel structure 205 of FIGS. 2A, 3B, and 2C. Additionally, an oxide may form in response to exposing portions of the handle material 906 to oxygen at a high temperature during the thermal oxidation process. For example, in response to or during the thermal oxidation, the third oxide layer 232 and the fourth oxide layer 234 may form in response to exposing portions of the handle material 906 that define (e.g., a bottom portion of) the first and second trenches 902 and 904 to oxygen at a high temperature. The third oxide layer 232 and the fourth oxide layer 234 may be formed proximate to (e.g., on) the portions 906a and 906b, respectively.

Figure 10A:
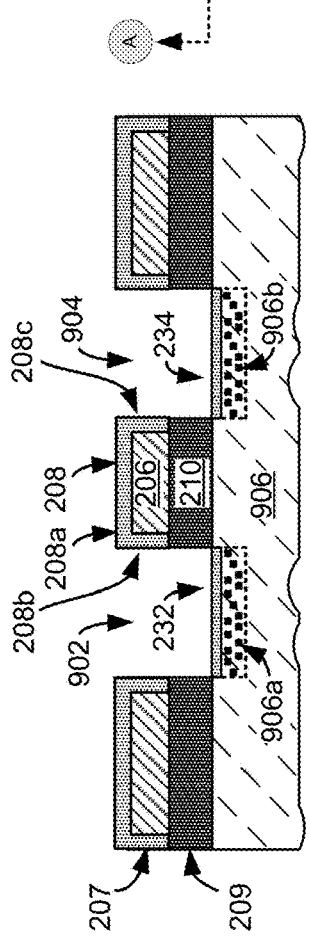
FIG. 10A illustrates a cross-sectional view (along line A of FIG. 10B) of an example of a second stage during fabrication of the semiconductor device of FIGS. 1A, 1B, and 1C.
Figure 10B:
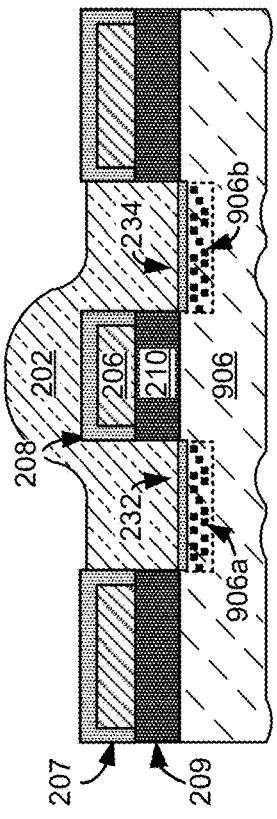
FIG. 10B illustrates a top view of an example of the second stage during fabrication of the semiconductor device of FIGS. 2A, 2B, and 2C.

FIGS. 10A and 10B illustrate an example of a second stage during fabrication of the semiconductor device 200 of FIGS. 2A, 2B, and 2C. The second stage may be subsequent to the first stage. The second stage includes forming the first gate structure 202. Forming the first gate structure 202 includes depositing material of the first gate structure 202 in the first trench 902 and in the second trench 904. Forming the first gate structure 202 also includes depositing the material of the first gate structure 202 on the first side 208a of the first oxide layer 208. The first oxide layer 208 may be between portions of the first gate structure 202 and the portion of the semiconductive layer 207 between the first and second trenches 902 and 904 (e.g., may be between the first gate structure 202 and the channel region 206). Thus, the first gate structure 202 may not contact the channel region 206. In some examples, the first oxide layer 208 serves as a gate oxide between portions of the first contact structure and the channel region 206. Additionally, the second oxide layer 210 may be between portions of the first gate structure 202 and the channel region 206. In conjunction, the first oxide layer 208 and the second oxide layer 210 may two-dimensionally surround the channel region 206.

Figure 11A:
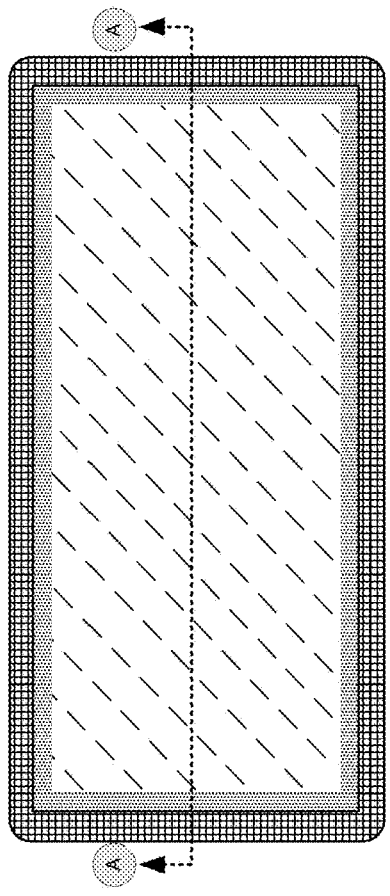
FIG. 11A illustrates a cross-sectional view (along line A of FIG. 11B) of an example of a third stage during fabrication of the semiconductor device of FIGS. 2A, 2B, and 2C.
Figure 11B:
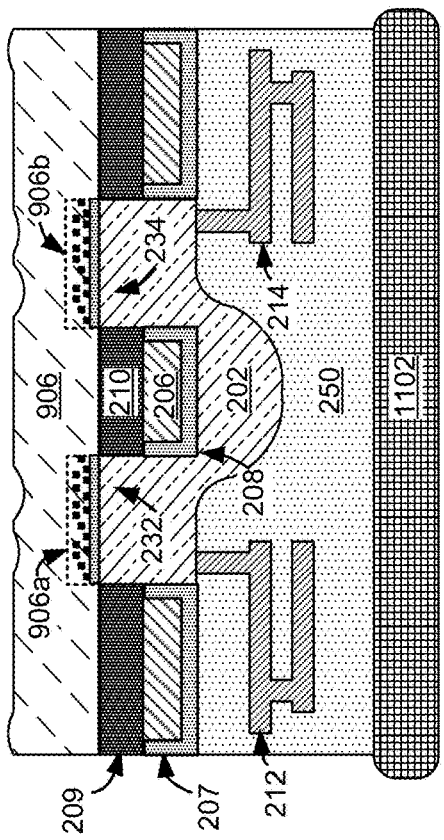
FIG. 11B illustrates a top view of an example of the third stage during fabrication of the semiconductor device of FIGS. 2A, 2B, and 2C.

FIGS. 11A and 11B illustrate an example of a third stage during fabrication of the semiconductor device 200 of FIGS. 2A, 2B, and 2C. The third stage may be subsequent to the second stage. The third stage includes forming the first metallization 212, the second metallization 214, or both. The first metallization 212 and the second metallization 214 may be formed of or include conductive material, such as a metal.

The third stage also includes forming a dielectric portion 250. The dielectric portion 250 may be formed of dielectric material. In some examples, the dielectric portion 250 is formed of a polymer, such as a polyimide. The dielectric portion 250 may be formed using a deposition process, such as CVD.

The third stage also includes performing a layer transfer process to couple a carrier wafer 1102 to the first gate structure 202 subsequent to forming the metallization (e.g., the first metallization 212, the second metallization 214, or both) and the dielectric portion 250. The carrier wafer 1102 may be coupled to the first gate structure 102 such that the semiconductive layer 207 is between the buried oxide layer 209 and the carrier wafer 1102. For example, subsequent to forming the metallization and the dielectric portion 250, the wafer may be flipped and bonded or adhered to the carrier wafer 1102. The carrier wafer 1102 may correspond to a CMOS wafer. In some examples, the carrier wafer 1102 is formed of or includes glass.

Figure 12A:
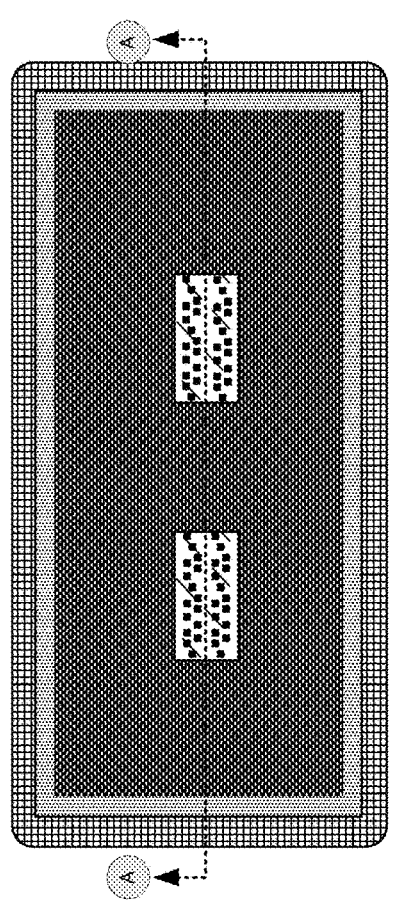
FIG. 12A illustrates a cross-sectional view (along line A of FIG. 12B) of an example of a fourth stage during fabrication of the semiconductor device of FIGS. 2A, 2B, and 2C.
Figure 12B:
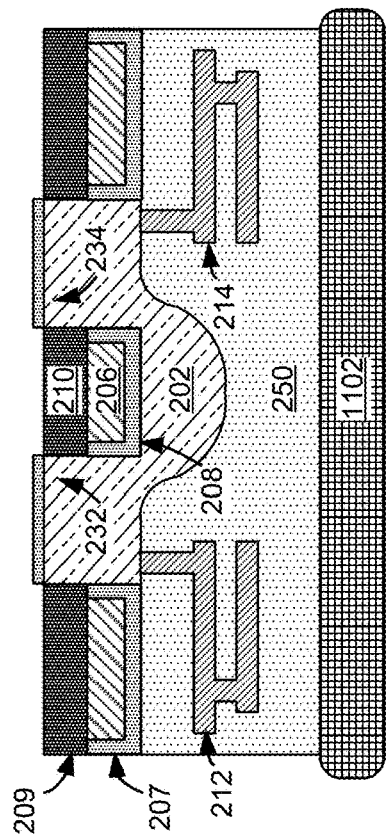
FIG. 12B illustrates a top view of an example of the fourth stage during fabrication of the semiconductor device of FIGS. 2A, 2B, and 2C.

FIGS. 12A and 12B illustrate an example of a fourth stage during fabrication of the semiconductor device 200 of FIGS. 2A, 2B, and 2C. The fourth stage may be subsequent to the third stage. The fourth stage includes removing at least a portion of the handle material 906. For example, portions of the handle material 906 other than the portions 906a and 906b may be removed using a grinding process, an etching process (e.g., a wet etch), or both. The portions 906a and 906b are doped with a material that provides sufficient selectivity to prevent the portions 906a and 906b from being removed during an etching process to etch the handle material 906. Removing the portions of the handle material 906 other than the portions 906a and 906b will expose the second oxide layer 210.

The fourth stage additionally includes performing a selective etch to remove the portions 906a and 906b. The etch used to remove the portions 906a and 906b is configured to not etch (e.g., to not entirely etch) the third and fourth oxide layers 232 and 234. Thus, at least a portion of each of the third and fourth oxide layers 232 and 234 remains subsequent to performing the selective etch to remove the portions 906a and 906b. The third and fourth oxide layers 232 and 234 that remain subsequent to removing the portions 906a and 906b provide electrical isolation between the first gate structure 202 and the second gate structure 204, enabling the first and second gate structures 202 and 204 to be independently biased.

FIGS. 13A and 13B illustrate an example of a fifth stage during fabrication of the semiconductor device 200 of FIGS. 2A, 2B, and 2C. The fifth stage may be subsequent to the fourth stage. The fifth stage includes forming the second gate structure 204. The second gate structure 204 may be formed by depositing material of the second gate structure 204 on the second oxide layer 210. Forming the second gate structure 204 may additionally include depositing material of the second gate structure 204 on the third and fourth oxide layers 232 and 234. The third oxide layer 232 and the fourth oxide layer 234 are located between the second gate structure 204 and the first gate structure 202. Thus, the first gate structure 202 is not in contact with the second gate structure 204. Because the first gate structure 202 is not in contact with the second gate structure 204, during operation, the first gate structure 202 may be used to bias the channel structure 205 independently of the second gate structure 204, and the second gate structure 204 may be used to bias the channel structure 205 independently of the first gate structure 202. Thus, the first gate structure 202 and the second gate structure 204 may provide for greater flexibility in controlling the channel region 206 than gate structures that includes a single gate. Additionally, the second oxide layer 210 may be located between the second gate structure 204 and the channel region 206, and may serve as a gate oxide for the second gate structure 204 during operation of the semiconductor device 200 of FIGS. 2A, 2B, and 2C.

Referring to FIGS. 2A, 2B, and 2C, an example of a sixth stage during fabrication of the semiconductor device 200 is illustrated. The sixth stage may be performed subsequent to the fifth stage. The sixth stage may include forming a passivation layer 260. The passivation layer 260 may be formed using a deposition process, such as CVD. In some examples, a trench 262 may be formed in the 260 and a bond pad [not illustrated] may be formed in the trench 262. The sixth stage may include removing the carrier wafer 1102 of FIGS. 13A and 13B.

Figure 14:
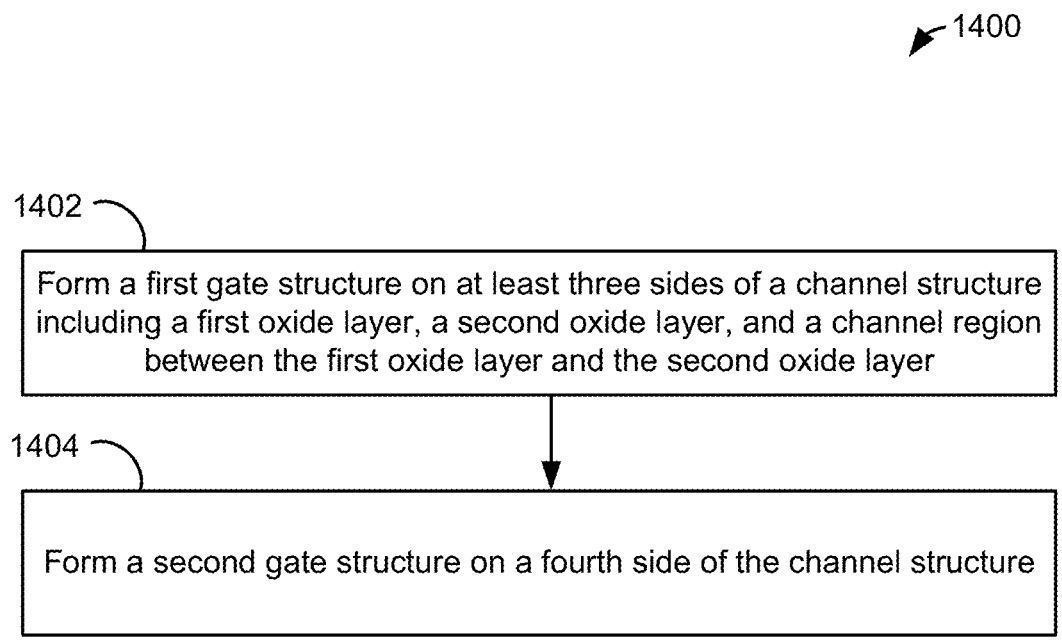
FIG. 14 is a flow chart of a particular illustrative example of a method of forming the semiconductor device of FIGS. 1A, 1B, and 1C or the semiconductor device of FIGS. 2A, 2B, and 2C.

Referring to FIG. 14, a flow chart of an illustrative example of a method 1400 of fabricating an electronic device is depicted. The electronic device may include the semiconductor device 100 of FIGS. 1A, 1B, and 1C or the semiconductor device 200 of FIGS. 2A, 2B, and 2C. The method 1400 may be performed using a SOI wafer.

The method 1400 may include, at 1402, forming a first gate structure on at least three sides of a channel structure that includes a first oxide layer, a second oxide layer, and a channel region between the first oxide layer and the second oxide layer. For example, the first gate structure may correspond to the first gate structure 102 of FIGS. 1A, 1B, and 1C or may correspond to the first gate structure 202 of FIGS. 2A, 2B, and 2C.

In examples in which the first gate structure corresponds to the first gate structure 102 of FIGS. 1A, 1B, and 1C, the first gate structure 102 may be formed as described above with reference to the second stage of FIGS. 3A and 3B. In these examples, the channel structure may correspond to the channel structure 105 of FIGS. 1A, 1B, and 1C, the first oxide layer may correspond to the first oxide layer 108, the second oxide layer may correspond to the second oxide layer 110, and the channel region may correspond to the channel region 106 of FIGS. 1A, 1B, and 1C. In some implementations, forming the first gate structure 102 includes depositing material of the first gate structure 102 in the first trench 302 and in the second trench 304 of FIGS. 3A and 3B.

In examples in which the first gate structure corresponds to the first gate structure 202 of FIGS. 2A, 2B, and 2C, the first gate structure 202 may be formed as described above with reference to the second stage of FIGS. 10A and 10B. In these examples, the channel structure may correspond to the channel structure 205 of FIGS. 2A, 2B, and 2C, the first oxide layer may correspond to the first oxide layer 208, the second oxide layer may correspond to the second oxide layer 210, and the channel region may correspond to the channel region 206 of FIGS. 2A, 2B, and 2C. In some implementations, forming the first gate structure 202 includes depositing material of the first gate structure 202 in the first trench 902 and in the second trench 904 of FIGS. 9A and 9B.

The method 1400 may include, at 1404, forming a second gate structure on a fourth side of the channel structure. For example, the second gate structure may correspond to the second gate structure 104 of FIGS. 1A, 1B, and 1C or may correspond to the second gate structure 204 of FIGS. 2A, 2B, and 2C.

In examples in which the second gate structure corresponds to the second gate structure 104 of FIGS. 1A, 1B, and 1C, the second gate structure 104 may be formed as described above with reference to the sixth stage of FIGS. 8A and 8B. In these examples, the first gate structure and the second gate structure two-dimensionally surround the channel structure.

In examples in which the second gate structure corresponds to the second gate structure 204 of FIGS. 2A, 2B, and 2C, the second gate structure 204 may be formed as described above with reference to the fifth stage of FIGS. 13A and 13B. In these examples, the first gate structure 202 is not in contact with the second gate structure 204. Because the first gate structure 202 is not in contact with the second gate structure 204, the first and second gate structures 202 and 204 may each be used independently to bias the channel structure 205 during operation of the semiconductor device 200.

In some implementations, the method 1400 additionally includes etching a first trench in a semiconductive layer and a buried oxide layer of a SOI wafer. In these examples, the method 1400 additionally includes etching a second trench in the semiconductive layer and the buried oxide layer. For example, the first and second trenches may correspond to the first and second trenches 302 and 304 of FIGS. 3A and 3B, and may be formed as described above with reference to the first stage of fabricating the semiconductor device 100 of FIGS. 1A, 1B, and 1C. As another example, the first and second trenches may correspond to the first and second trenches 902 and 904 of FIGS. 9A and 9B, and may be formed as described above with reference to the first stage of fabricating the semiconductor device 200 of FIGS. 2A, 2B, and 2C.

In some implementations, the method 1400 additionally includes performing a layer transfer process to couple a carrier wafer to the first gate structure such that the semiconductive layer is between the buried oxide layer and the carrier wafer. For example, the carrier wafer may correspond to the carrier wafer 502 of FIGS. 5A and 5B and the layer transfer process may be performed as described above with reference to the third stage of fabricating the semiconductor device 100 of FIGS. 1A, 1B, and 1C. As another example, the carrier wafer may correspond to the carrier wafer 1102 of FIGS. 11A and 11B and the layer transfer process may be performed as described above with reference to the third stage of fabricating the semiconductor device 200 of FIGS. 2A, 2B, and 2C.

In some implementations, the method 1400 additionally includes removing at least a portion of a handle material of the SOI wafer to expose the second oxide layer. For example, the handle material may correspond to the handle material 906 of FIGS. 11A and 11B and the at least the portion of the handle material 906 may correspond to portions of the handle material 906 other than the portions 906a and 906b. In these examples, the at least the portion of the handle material 906 is removed as described above with reference to the fourth stage of fabricating the semiconductor device 200 of FIGS. 2A, 2B, and 2C. Removing the at least the portion of the handle material 906 exposes the second oxide layer 210 of FIGS. 12A and 12B. In these examples, forming the second gate structure as in 1404 of the method 1400 includes depositing material of the second gate structure on the second oxide layer 210 that was exposed by removing the at least the portion of the handle material 906.

In some implementations, the method 1400 additionally includes removing a handle material of the SOI wafer. For example, the handle material may correspond to the handle material 306 of FIGS. 5A and 5B and the handle material 306 is removed as described above with reference to the fourth stage of fabricating the semiconductor device 100 of FIGS. 1A, 1B, and 1C. In these examples, the method 1400 additionally includes thinning a buried oxide layer to form a thinned buried oxide layer including a portion corresponding to the second oxide layer. For example, the buried oxide layer may correspond to the buried oxide layer 309 of FIGS. 6A and 6B, the thinned buried oxide layer may correspond to the thinned buried oxide layer 709 of FIGS. 7A and 7B, and the buried oxide layer 309 may be thinned to form the thinned buried oxide layer 709 as described above with reference to the fifth stage of fabricating the IC of FIGS. 1A, 1B, and 1C. In these examples, forming the second gate structure at 1404 of the method 1400 includes depositing material of the second gate structure on the second oxide layer as described above with reference to the sixth stage of fabricating the IC of FIGS. 1A, 1B, and 1C. In these examples, the second oxide layer may be located between opposing sides of the first gate structure.

Figure 15:
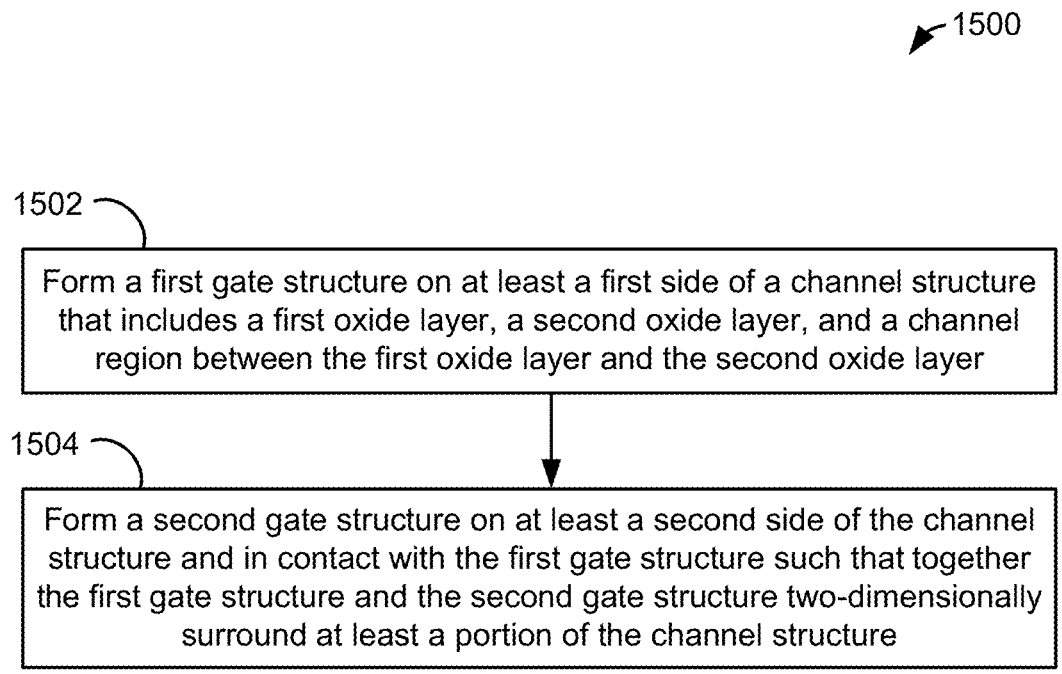
FIG. 15 is a flow chart of a particular illustrative example of a method of forming the semiconductor device of FIGS. 1A, 1B, and 1C.

Referring to FIG. 15, a flow chart of an illustrative example of a method 1500 of fabricating an electronic device is depicted. The electronic device may include the semiconductor device 100 of FIGS. 1A, 1B, and 1C.

The method 1500 may include, at 1502, forming a first gate structure on at least a first side of a channel structure that includes a first oxide layer, a second oxide layer, and a channel region between the first oxide layer and the second oxide layer. For example, the first gate structure may correspond to the first gate structure 102 of FIGS. 1A, 1B, and 1C and the first gate structure 102 may be formed as described above with reference to the second stage of FIGS. 3A and 3B. In these examples, the channel structure may correspond to the channel structure 105 of FIGS. 1A, 1B, and 1C, the first oxide layer may correspond to the first oxide layer 108, the second oxide layer may correspond to the second oxide layer 110, and the channel region may correspond to the channel region 106 of FIGS. 1A, 1B, and 1C. In some implementations, forming the first gate structure 102 includes depositing material of the first gate structure 102 in the first trench and in the second trenches 302 and 304, respectively, of FIGS. 3A and 3B.

The method 1500 includes, at 1504, forming a second gate structure on at least a second side of the channel structure and in contact with the first gate structure such that together the first gate structure and the second gate structure two-dimensionally surround at least a portion of the channel structure. For example, the second gate structure may correspond to the second gate structure 104 of FIGS. 1A, 1B, and 1C, and the second gate structure 104 may be formed as described above with reference to the sixth stage of FIGS. 8A and 8B. The first gate structure 102 and the second gate structure 104 two-dimensionally surround the channel structure.

In some implementations, the method 1500 additionally includes etching a first trench in a semiconductive layer and a buried oxide layer of a SOI wafer. In these examples, the method 1500 additionally includes etching a second trench in the semiconductive layer and the buried oxide layer. For example, the first and second trenches may correspond to the first and second trenches 302 and 304 of FIGS. 3A and 3B and may be formed as described above with reference to the first stage of fabricating the semiconductor device 100 of FIGS. 1A, 1B, and 1C. In these examples, forming the first gate structure at 1502 may include depositing material of the first gate structure in the first trench and in the second trenches 302 and 304, respectively.

In some implementations, the method 1500 additionally includes performing a layer transfer process to couple a carrier wafer to the first gate structure such that the semiconductive layer is between the buried oxide layer and the carrier wafer. For example, the carrier wafer may correspond to the carrier wafer 502 of FIGS. 5A and 5B and may the layer transfer process may be performed as described above with reference to the third stage of fabricating the semiconductor device 100 of FIGS. 1A, 1B, and 1C.

In some implementations, the method 1500 additionally includes removing a handle material of the SOI wafer. For example, the handle material may correspond to the handle material 306 of FIGS. 5A and 5B and the handle material 306 is removed as described above with reference to the fourth stage of fabricating the semiconductor device 100 of FIGS. 1A, 1B, and 1C. In these examples, the method 1500 additionally includes thinning a buried oxide layer to form a thinned buried oxide layer including a portion corresponding to the second oxide layer. For example, the buried oxide layer may correspond to the buried oxide layer 309 of FIGS. 6A and 6B, the thinned buried oxide layer may correspond to the thinned buried oxide layer 709 of FIGS. 7A and 7B, and the buried oxide layer 309 may be thinned to form the thinned buried oxide layer 709 as described above with reference to the fifth stage of fabricating the semiconductor device 100 of FIGS. 1A, 1B, and 1C. In these examples, forming the second gate structure at 1504 of the method 1500 includes depositing material of the second gate structure on the second oxide layer as described above with reference to the sixth stage of fabricating the semiconductor device 100 of FIGS. 1A, 1B, and 1C. In these examples, the second oxide layer may be located between opposing sides of the first gate structure and at least a portion of the second gate structure is located between the opposing sides of the first gate structure.

Referring to FIG. 16, a block diagram of a particular illustrative example of a wireless communication device is depicted and generally designated 1600. The wireless communication device 1600 includes a processor 1610, such as a digital signal processor (DSP), coupled to a memory 1632 (e.g., a random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art).

FIG. 16 also shows a display controller 1626 that is coupled to the processor 1610 and to a display 1628. A coder/decoder (CODEC) 1634 may also be coupled to the processor 1610. A speaker 1636 and a microphone 1638 may be coupled to the CODEC 1634.

FIG. 16 also indicates that a wireless controller 1640 may be coupled to the processor 1610 and may be further coupled to an antenna 1642. The wireless controller 1640 may include one or more ICs 1680, such as RF IC components (e.g., switches). The one or more ICs 1680 may include or may correspond to the semiconductor device 100 of FIGS. 1A, 1B, and 1C, the semiconductor device 200 of FIGS. 2A, 2B, and 2C, or a combination thereof. The one or more ICs 1680 may be configured to route RF signals as part of an antenna switch or a distribution switch.

In a particular implementation, the processor 1610, the display controller 1626, the memory 1632, the CODEC 1634, and the wireless controller 1640 are included in a system-in-package or system-on-chip device 1622. In a particular implementation, an input device 1630 and a power supply 1644 are coupled to the system-on-chip device 1622. Moreover, in a particular example, as illustrated in FIG. 16, the display 1628, the input device 1630, the speaker 1636, the microphone 1638, the antenna 1642, and the power supply 1644 are external to the system-on-chip device 1622. However, each of the display 1628, the input device 1630, the speaker 1636, the microphone 1638, the antenna 1642, and the power supply 1644 may be coupled to a component of the system-on-chip device 1622, such as an interface or a controller.

In conjunction with the described embodiments, an apparatus is disclosed that includes means for providing a conductive channel. The means for providing the conductive channel may correspond to the channel structure 105 of FIG. 1A or the channel structure 205 of FIG. 2A. The apparatus additionally includes first means for gating the means for providing the conductive channel. The first means for gating is proximate to at least three sides of the means for providing the conductive channel. For example, the first means for gating may correspond to the first gate structure 102 of FIG. 1A or the first gate structure 202 of FIG. 2A. The apparatus additionally includes second means for gating the means for providing the conductive channel. The second means for gating is proximate to at least a fourth side of the means for providing the conductive channel. For example, the second means for gating may correspond to the second gate structure 104 of FIG. 1A or the second gate structure 204 of FIG. 2A.

Additionally, an apparatus is disclosed that includes means for providing a conductive channel. The means for providing the conductive channel may correspond to the channel structure 105 of FIG. 1A or the channel structure 205 of FIG. 2A. The apparatus additionally includes first means for gating the means for providing the conductive channel. The first means for gating is proximate to at least a first side of the means for providing the conductive channel. For example, the first means for gating may correspond to the first gate structure 102 of FIG. 1A. The apparatus additionally includes second means for gating the means for providing the conductive channel. The second means for gating is proximate to at least a second side of the means for providing the conductive channel. The second means for gating is in contact with the first means for gating. For example, the second means for gating may correspond to the second gate structure 104 of FIG. 1A. Together, the first means for gating and the second means for gating two-dimensionally surround at least a portion of the means for providing the conductive channel as described above with reference to FIGS. 1A, 1B, and 1C.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then integrated into electronic devices, as described further with reference to FIG. 17.

Referring to FIG. 17, a particular illustrative implementation of an electronic device manufacturing (e.g., fabricating) process is depicted and generally designated 1700. Physical device information 1702 is received at the manufacturing process 1700, such as at a research computer 1706. The physical device information 1702 may include design information representing at least one physical property of a semiconductor device, such as the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof. For example, the physical device information 1702 may include physical parameters, material characteristics, and structure information that is entered via a user interface 1704 coupled to the research computer 1706. The research computer 1706 includes a processor 1708, such as one or more processing cores, coupled to a computer readable medium (e.g., a non-transitory computer-readable storage medium), such as a memory 1710. The memory 1710 may store computer readable instructions that are executable to cause the processor 1708 to transform the physical device information 1702 to comply with a file format and to generate a library file 1712.

In a particular implementation, the library file 1712 includes at least one data file including the transformed design information. For example, the library file 1712 may include a library of semiconductor devices including a device that includes the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof, that is provided for use with an electronic design automation (EDA) tool 1720.

The library file 1712 may be used in conjunction with the EDA tool 1720 at a design computer 1714 including a processor 1716, such as one or more processing cores, coupled to a memory 1718. The EDA tool 1720 may be stored as processor executable instructions at the memory 1718 to enable a user of the design computer 1714 to design a circuit including the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof, of the library file 1712. For example, a user of the design computer 1714 may enter circuit design information 1722 via a user interface 1724 coupled to the design computer 1714. The circuit design information 1722 may include design information representing at least one physical property of a semiconductor device, such as the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof. To illustrate, the circuit design property may include identification of particular circuits and relationships to other elements in a circuit design, positioning information, feature size information, interconnection information, or other information representing a physical property of a semiconductor device.

The design computer 1714 may be configured to transform the design information, including the circuit design information 1722, to comply with a file format. To illustrate, the file format may include a database binary file format representing planar geometric shapes, text labels, and other information about a circuit layout in a hierarchical format, such as a Graphic Data System (GDSII) file format. The design computer 1714 may be configured to generate a data file including the transformed design information, such as a GDSII file 1726 that includes information describing the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof, in addition to other circuits or information. To illustrate, the data file may include information corresponding to a system-on-chip (SOC) that includes the first and second gate structures 102 and 104 of the semiconductor device 100 of FIGS. 1A, 1B, and 1C; the first and second gate structures 202 and 204 of the semiconductor device 200 of FIGS. 2A, 2B, and 2C, and that also includes additional electronic circuits and components within the SOC.

The GDSII file 1726 may be received at a fabrication process 1728 to fabricate the first and second gate structures 102 and 104 of the semiconductor device 100 of FIGS. 1A, 1B, and 1C; the first and second gate structures 202 and 204 of the semiconductor device 200 of FIGS. 2A, 2B, and 2C, or any combination thereof, according to transformed information in the GDSII file 1726. For example, a device manufacturing process may include providing the GDSII file 1726 to a mask manufacturer 1730 to create one or more masks, such as masks to be used with photolithography processing, illustrated as a representative mask 1732. The mask 1732 may be used during the fabrication process to generate one or more wafers 1733, which may be tested and separated into dies, such as a representative die 1736. The die 1736 includes a circuit including a device that includes the first and second gate structures 102 and 104 of the semiconductor device 100 of FIGS. 1A, 1B, and 1C; the first and second gate structures 202 and 204 of the semiconductor device 200 of FIGS. 2A, 2B, and 2C, or any combination thereof.

For example, the fabrication process 1728 may include a processor 1734 and a memory 1735 to initiate and/or control the fabrication process 1728. The memory 1735 may include executable instructions such as computer-readable instructions or processor-readable instructions. The executable instructions may include one or more instructions that are executable by a computer such as the processor 1734. In a particular example, the executable instructions may cause a computer to perform the method 1400 of FIG. 14 (or at least a portion thereof) and/or the method 1500 of FIG. 15 (or at least a portion thereof).

The fabrication process 1728 may be implemented by a fabrication system that is fully automated or partially automated. For example, the fabrication process 1728 may be automated according to a schedule. The fabrication system may include fabrication equipment (e.g., processing tools) to perform one or more operations to form a semiconductor device. For example, the fabrication equipment may be configured to deposit one or more materials using chemical vapor deposition (CVD) and/or physical vapor deposition (PVD), pattern materials using a single-mask or multi-mask litho-etch process (e.g., two-mask LELE), pattern materials using a litho-freeze-litho-etch (LFLE) process, pattern materials using a self-aligned double patterning (SADP) process, epitaxially grow one or more materials, conformally deposit one or more materials, apply a hardmask, apply an etching mask, perform etching, perform planarization, form a dummy gate stack, form a gate stack, perform a standard clean 1 type, etc. In a particular example, the fabrication process 1728 corresponds to a semiconductor manufacturing process associated with a technology node smaller than 14 nm (e.g., 10 nm, 7 nm, etc.). The specific process or combination of processes used to manufacture a device (e.g., the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof) may be based on design constraints and available materials/equipment. Thus, in particular implementations, different processes may be used than described with reference to FIGS. 1-17 during manufacture of the device.

The fabrication system (e.g., an automated system that performs the fabrication process 1728) may have a distributed architecture (e.g., a hierarchy). For example, the fabrication system may include one or more processors, such as the processor 1734, one or more memories, such as the memory 1735, and/or controllers that are distributed according to the distributed architecture. The distributed architecture may include a high-level processor that controls or initiates operations of one or more low-level systems. For example, a high-level portion of the fabrication process 1728 may include one or more processors, such as the processor 1734, and the low-level systems may each include or may be controlled by one or more corresponding controllers. A particular controller of a particular low-level system may receive one or more instructions (e.g., commands) from a particular high-level system, may issue sub-commands to subordinate modules or process tools, and may communicate status data back to the particular high-level. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component may include a processor, such as the processor 1734.

Alternatively, the processor 1734 may be a part of a high-level system, subsystem, or component of the fabrication system. In another implementation, the processor 1734 includes distributed processing at various levels and components of a fabrication system.

The executable instructions included in the memory 1735 may enable the processor 1734 to form (or initiate formation of) the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof. In a particular implementation, the memory 1735 is a non-transitory computer-readable medium storing computer-executable instructions that are executable by the processor 1734 to cause the processor 1734 to initiate formation of a device in accordance with at least a portion of the method 1400 of FIG. 14 (or at least a portion thereof) and/or the method 1500 of FIG. 15 (or at least a portion thereof). For example, the computer executable instructions may be executable to cause the processor 1734 to initiate formation of the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof. As an illustrative example, the processor 1734 may initiate or control one or more steps of the method 1400 of FIG. 14 (or at least a portion thereof) and/or the method 1500 of FIG. 15 (or at least a portion thereof).

The die 1736 may be provided to a packaging process 1738 where the die 1736 is incorporated into a representative package 1740. For example, the package 1740 may include the single die 1736 or multiple dies, such as a system-in-package (SiP) arrangement. The package 1740 may be configured to conform to one or more standards or specifications, such as Joint Electron Device Engineering Council (JEDEC) standards.

Information regarding the package 1740 may be distributed to various product designers, such as via a component library stored at a computer 1746. The computer 1746 may include a processor 1748, such as one or more processing cores, coupled to a memory 1750. A printed circuit board (PCB) tool may be stored as processor executable instructions at the memory 1750 to process PCB design information 1742 received from a user of the computer 1746 via a user interface 1744. The PCB design information 1742 may include physical positioning information of a packaged semiconductor device on a circuit board, the packaged semiconductor device corresponding to the package 1740 including the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof.

The computer 1746 may be configured to transform the PCB design information 1742 to generate a data file, such as a GERBER file 1752 with data that includes physical positioning information of a packaged semiconductor device on a circuit board, as well as layout of electrical connections such as traces and vias, where the packaged semiconductor device corresponds to the package 1740 including the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof. In other implementations, the data file generated by the transformed PCB design information may have a format other than a GERBER format.

The GERBER file 1752 may be received at a board assembly process 1754 and used to create PCBs, such as a representative PCB 1756, manufactured in accordance with the design information stored within the GERBER file 1752. For example, the GERBER file 1752 may be uploaded to one or more machines to perform various steps of a PCB production process. The PCB 1756 may be populated with electronic components including the package 1740 to form a representative printed circuit assembly (PCA) 1758.

The PCA 1758 may be received at a product manufacturing process 1760 and integrated into one or more electronic devices, such as a first representative electronic device 1762 and a second representative electronic device 1764. For example, the first representative electronic device 1762, the second representative electronic device 1764, or both, may include or correspond to the wireless communication device 1600 of FIG. 16. As an illustrative, non-limiting example, the first representative electronic device 1762, the second representative electronic device 1764, or both, may include a communications device, a fixed location data unit, a mobile location data unit, a mobile phone, a cellular phone, a satellite phone, a computer, a tablet, a portable computer, or a desktop computer. Alternatively or additionally, the first representative electronic device 1762, the second representative electronic device 1764, or both, may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, any other device that stores or retrieves data or computer instructions, or a combination thereof, into which the into which the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof is integrated.

As another illustrative, non-limiting example, one or more of the electronic devices 1762 and 1764 may include remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 17 illustrates remote units according to teachings of the disclosure, the disclosure is not limited to these illustrated units. Aspects, examples, and/or implementations of the disclosure may be suitably employed in any device which includes active integrated circuitry including memory and on-chip circuitry. For example, one or more of the electronic device 1762 and 1764 may include cars, trucks, airplanes, boats, other vehicles, or appliances, such as refrigerators, microwaves, washing machines, security systems, other appliances, or a combination thereof. In a particular implementation, one or more of the electronic device 1762 and 1764 may utilize memory and/or wireless communication.

A device that includes the first and second gate structures 102 and 104 of the semiconductor device 100 of FIGS. 1A, 1B, and 1C; the first and second gate structures 202 and 204 of the semiconductor device 200 of FIGS. 2A, 2B, and 2C; or any combination thereof, may be fabricated, processed, and incorporated into an electronic device, as described in the illustrative process 1700. One or more aspects of the implementations or examples disclosed with respect to FIGS. 1-17 may be included at various processing stages, such as within the library file 1712, the GDSII file 1726 (e.g., a file having a GDSII format), and the GERBER file 1752 (e.g., a file having a GERBER format), as well as stored at the memory 1710 of the research computer 1706, the memory 1718 of the design computer 1714, the memory 1750 of the computer 1746, the memory of one or more other computers or processors (not shown) used at the various stages, such as at the board assembly process 1754, and also incorporated into one or more other physical implementations such as the mask 1732, the die 1736, the package 1740, the PCA 1758, other products such as prototype circuits or devices (not shown), or any combination thereof. Although various representative stages of production from a physical device design to a final product are depicted, in other implementations fewer stages may be used or additional stages may be included. Similarly, the process 1700 may be performed by a single entity or by one or more entities performing various stages of the process 1700.

Although one or more of FIGS. 1-17 may illustrate systems, devices, and/or methods according to the teachings of the disclosure, the disclosure is not limited to these illustrated systems, devices, and/or methods. Aspects, examples, and/or implementations of the disclosure may be suitably employed in any device that includes integrated circuitry including memory, a processor, and on-chip circuitry.

One or more functions or components of any of FIGS. 1-17 as illustrated or described herein may be combined with one or more other portions of another of FIGS. 1-17. Accordingly, no single aspect, example, and/or implementation described herein should be construed as limiting and aspects, examples, and/or implementations of the disclosure may be suitably combined without departing form the teachings of the disclosure.

Those of skill would further appreciate that the various illustrative logical blocks, configurations, modules, circuits, and algorithm steps described in connection with the aspects, examples, and/or implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects, examples, and/or implementations disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal. A storage device is not a signal.

The previous description of the disclosed aspects, examples, and/or implementations is provided to enable a person skilled in the art to make or use the disclosed aspects, examples, and/or implementations. Various modifications to these aspects, examples, and/or implementations will be readily apparent to those skilled in the art, and the principles defined herein may be applied to other aspects, examples, and/or implementations without departing from the scope of the disclosure. Thus, the present disclosure is not intended to be limited to the aspects, examples, and/or implementations shown herein but is to be accorded the widest scope possible consistent with the principles and novel features as defined by the following claims.

What is claimed is:

1. A semiconductor device, comprising:
    a portion of a silicon on insulator (SOI) wafer including a semiconductive layer and a buried oxide layer;
    a channel structure comprising a first oxide layer, a second oxide layer, and a channel region between the first oxide layer and the second oxide layer, wherein the second oxide layer includes at least a portion of the buried oxide layer of the SOI wafer;
    a first gate structure proximate to at least three sides of the channel structure, at least a portion of the first gate structure included in a plurality of trenches through the semiconductive layer and the buried oxide layer of the SOI wafer; and a second gate structure proximate to at least a fourth side of the channel structure.

2. The semiconductor device of claim 1, further comprising a source region and a drain region, wherein the channel structure is between the source region and the drain region.

3. The semiconductor device of claim 1, wherein the first gate structure is in contact with the second gate structure.

4. The semiconductor device of claim 1, wherein the first gate structure and the second gate structure two-dimensionally surround the channel structure.

5. The semiconductor device of claim 1, wherein the first gate structure is not in contact with the second gate structure.

6. The semiconductor device of claim 5, further comprising a third oxide layer between the second gate structure and the first gate structure.

7. The semiconductor device of claim 1, wherein the second gate structure includes at least a portion that is located between opposing sides of the first gate structure.

8. The semiconductor device of claim 1, wherein the first oxide layer and the second oxide layer together two-dimensionally surround the channel region.

9. A semiconductor device, comprising:
a portion of a silicon on insulator (SOI) wafer including a semiconductive layer and a buried oxide layer;
a channel structure comprising a first oxide layer, a second oxide layer, and a channel region between the first oxide layer and the second oxide layer, wherein the second oxide layer includes at least a portion of the buried oxide layer of the SOI wafer;
a first gate structure proximate to at least a first side of the channel structure, at least a portion of the first gate structure included in a plurality of trenches through the semiconductive layer and the buried oxide layer; and
a second gate structure proximate to at least a second side of the channel structure and in contact with the first gate structure,
wherein together the first gate structure and the second gate structure two-dimensionally surround at least a portion of the channel structure.

10. The semiconductor device of claim 9, wherein the first oxide layer has a first thickness that is distinct from a second thickness of the second oxide layer.

11. The semiconductor device of claim 9, wherein the first side is opposite the second side.

12. The semiconductor device of claim 9, wherein the second gate structure includes at least a portion that is located between opposing sides of the first gate structure.

13. The semiconductor device of claim 9, wherein the first oxide layer and the second oxide layer together two-dimensionally surround the channel region.

14. The semiconductor device of claim 1, wherein the first gate structure is coupled to a carrier wafer, and wherein the semiconductive layer is between the buried oxide layer and the carrier wafer.

* * * * *